(12) United States Patent
Ting et al.

(10) Patent No.: US 12,256,543 B2
(45) Date of Patent: Mar. 18, 2025

(54) MEMORY DEVICE AND METHOD OF FABRICATING THE SAME

(71) Applicant: MACRONIX International Co., Ltd., Hsinchu (TW)

(72) Inventors: Jung-Chuan Ting, Hsinchu County (TW); Ya-Chun Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 500 days.

(21) Appl. No.: 17/669,039

(22) Filed: Feb. 10, 2022

(65) Prior Publication Data
US 2023/0255028 A1 Aug. 10, 2023

(51) Int. Cl.
| | |
|---|---|
| H01L 29/76 | (2006.01) |
| H01L 23/528 | (2006.01) |
| H10B 41/10 | (2023.01) |
| H10B 41/27 | (2023.01) |
| H10B 41/35 | (2023.01) |
| H10B 43/10 | (2023.01) |
| H10B 43/27 | (2023.01) |
| H10B 43/35 | (2023.01) |
| H10D 30/67 | (2025.01) |

(52) U.S. Cl.
CPC ......... H10B 43/27 (2023.02); H01L 23/5283 (2013.01); H10B 41/10 (2023.02); H10B 41/27 (2023.02); H10B 41/35 (2023.02); H10B 43/10 (2023.02); H10B 43/35 (2023.02); H10D 30/6735 (2025.01)

(58) Field of Classification Search
CPC ........ H10B 43/27; H10B 41/10; H10B 41/27; H10B 41/35; H10B 43/10; H10B 43/35; H10B 43/50; H01L 23/5283; H01L 29/42392; G11C 11/5621

USPC .......................................................... 257/314
See application file for complete search history.

(56) References Cited

U.S. PATENT DOCUMENTS 10,079,267 B1 * 9/2018 Yeh ...................... H10N 70/011
11,552,095 B2 * 1/2023 Hishida .................. H10B 43/50

FOREIGN PATENT DOCUMENTS

| TW | 202121605 | 6/2021 |
| TW | 202121661 | 6/2021 |
| TW | 202143226 | 11/2021 |

OTHER PUBLICATIONS

"Office Action of Taiwan Counterpart Application", issued on Sep. 28, 2022, pp. 1-6.

* cited by examiner

*Primary Examiner* — Tan N Tran
(74) *Attorney, Agent, or Firm* — J.C. PATENTS

(57) ABSTRACT

A memory device includes a memory array and at least one first vertical transistor over a dielectric substrate. The at least one first vertical transistor is disposed above the dielectric substrate in a staircase region, and includes: a first wraparound gate layer, a channel pillar, a gate dielectric layer, a first source and drain region, and a second source and drain region. The first wraparound gate layer is laterally adjacent to a gate stack structure of the memory array. The channel pillar extends through the first wraparound gate layer. The gate dielectric layer is disposed between the channel pillar and the first wraparound gate layer. The first source and drain region is disposed below and electrically connected to the bottom of the channel pillar. The second source and drain region is disposed above and electrically connected to the top of the channel pillar.

8 Claims, 37 Drawing Sheets

MEMORY DEVICE AND METHOD OF FABRICATING THE SAME

BACKGROUND

Technical Field

The embodiment of the disclosure relates to a semiconductor device and a method of fabricating the same, and particularly, to a memory device and a method of fabricating the same.

Description of Related Art

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory.

For example, an X-decoder uses a high-voltage transistor with a large size as a pass transistor to pass a large voltage to a local word line to perform a memory array operation. As the number of stacked layers of the three-dimensional NAND flash memory increases, the area occupied by the pass transistor will also increase significantly.

SUMMARY

The embodiments of the disclosure provide a memory device which can reduce an area occupied by a pass transistor.

An embodiment of the disclosure provides a memory device including a dielectric substrate having an array region and a staircase region and a memory array. The memory array includes a gate stack structure and at least one first vertical transistor. The gate stack structure includes a plurality of gate layers and a plurality of insulating layers alternately disposed above the dielectric substrate in the array region and the staircase region. The at least one first vertical transistor is disposed above the dielectric substrate in the staircase region and includes a first wraparound gate layer, a channel pillar, a gate dielectric layer, a first source and drain region, and a second source and drain region. The first wraparound gate layer is laterally adjacent to the gate stack structure. The channel pillar extends through the first wraparound gate layer. The gate dielectric layer is disposed between the channel pillar and the first wraparound gate layer. The first source and drain region is located below a bottom of the channel pillar and is electrically connected to the bottom of the channel pillar. The second source and drain region is located above a top of the channel pillar and is electrically connected to the top of the channel pillar.

An embodiment of the disclosure provides a memory device including a substrate, a first interconnect structure, a memory array, a plurality of vertical transistors, and a second interconnect structure. The first interconnect structure is located on the substrate. The memory array is located on the first interconnect structure. The plurality of vertical transistors are located on the first interconnect structure. The second interconnect structure is located on the memory array and is electrically connected to the plurality of vertical transistors. The plurality of vertical transistors comprise a plurality of wraparound gate layers stacked on each other.

An embodiment of the disclosure provides a method of fabricating a memory device including the following steps. A first interconnect structure is formed on a substrate. A memory array is formed on the first interconnect structure. A plurality of pass transistors are formed on the first interconnect structure, and the plurality of pass transistors are laterally adjacent to the memory array. A second interconnect structure is formed on the memory array and the plurality of pass transistors, and are electrically connected to the memory array and the plurality of pass transistors.

In a memory device according to an embodiment of the disclosure, a vertical transistor is used as a pass transistor, which may be disposed in a staircase structure beside the memory array, so the occupied chip area may be significantly reduced.

In a method of fabricating a memory device according to an embodiment of the disclosure, a vertical transistor is used as a pass transistor. Formation of the pass transistor may be integrated with the process of forming the memory array, and the occupied chip area may be significantly reduced.

DESCRIPTION OF THE EMBODIMENTS

Figure 1A:
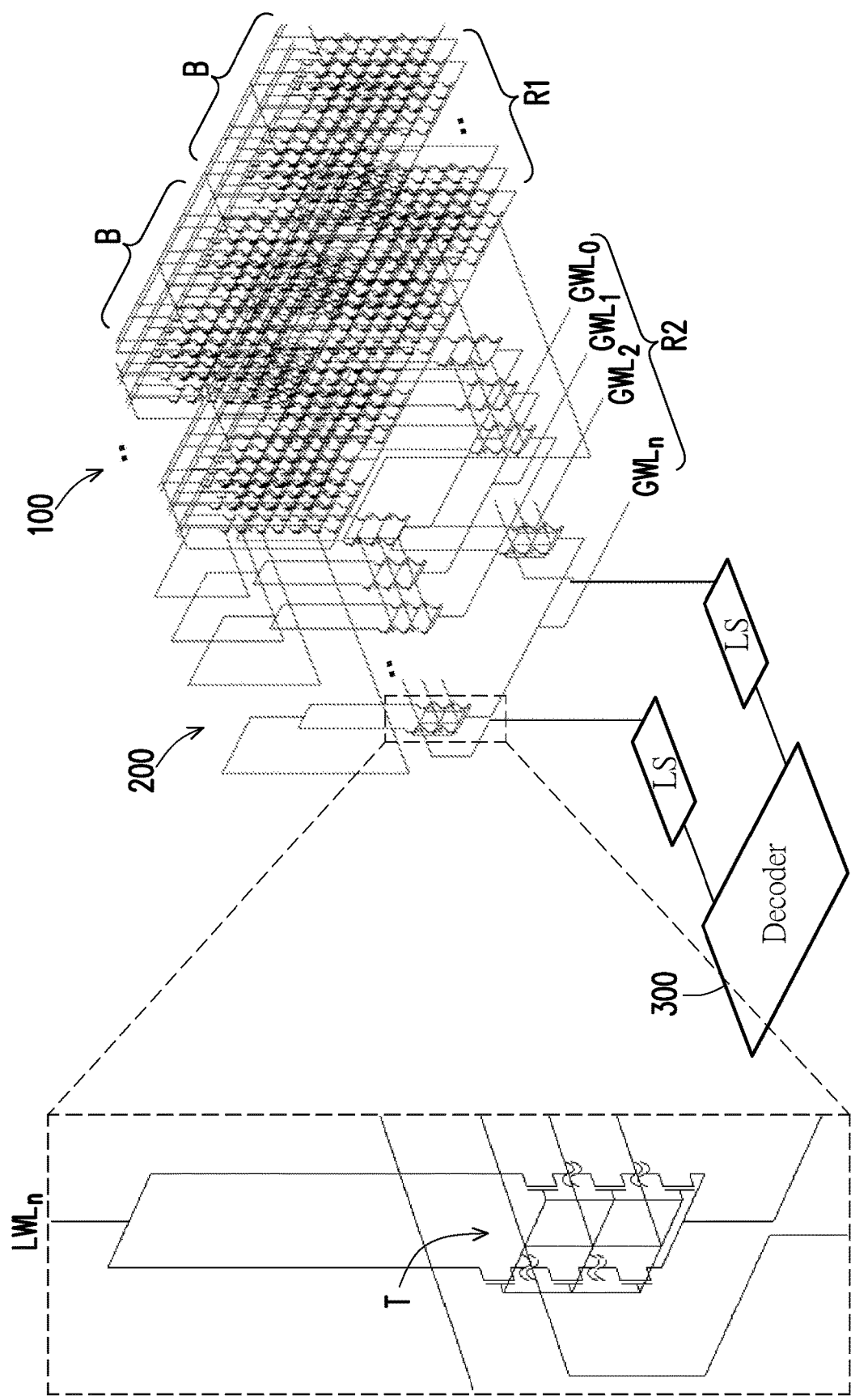
FIG. 1A is a schematic circuit diagram of a memory device.
Figure 1B:
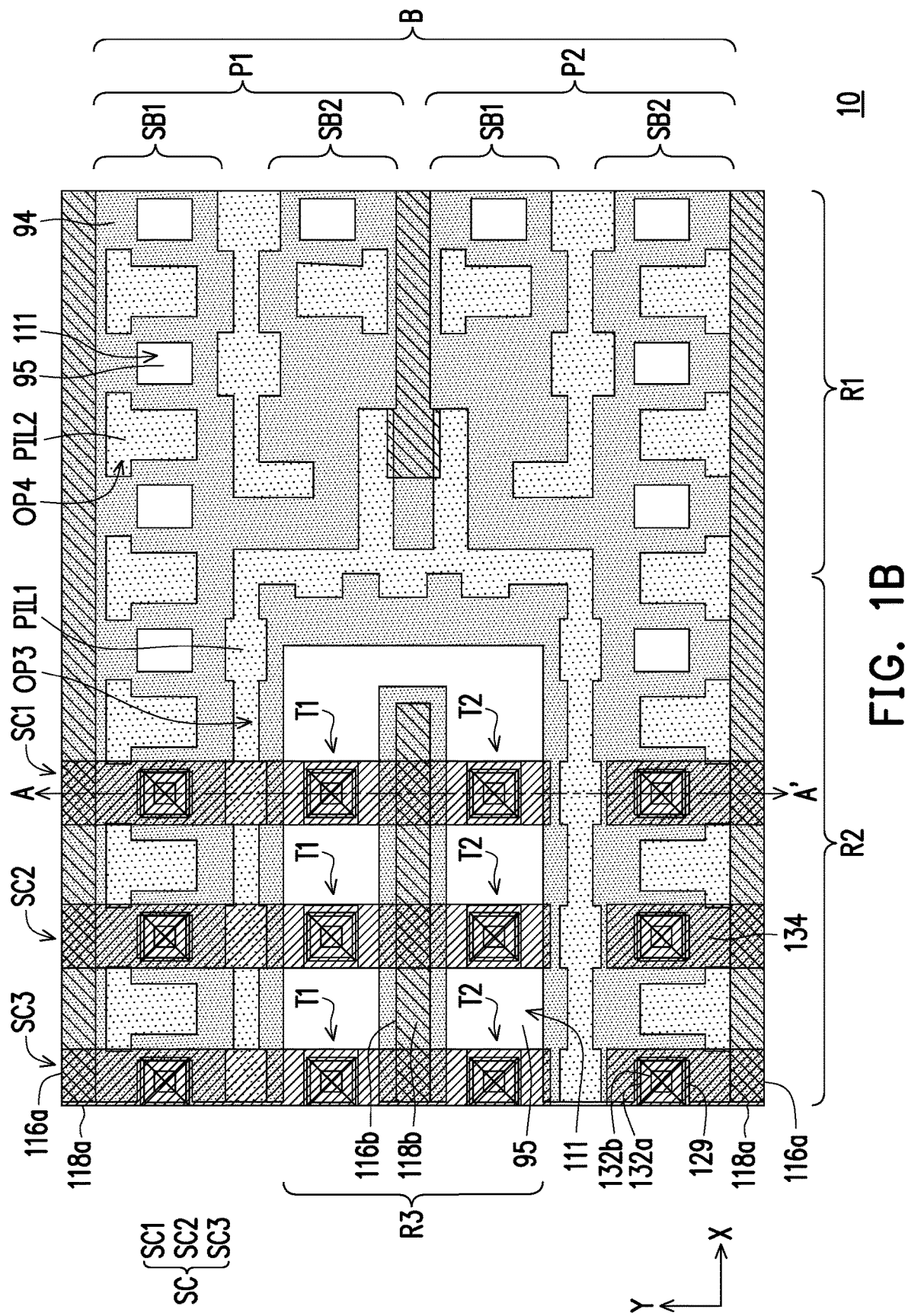
FIG. 1B is a partial top view of the memory device.

FIG. 1A is a schematic circuit diagram of a memory device. FIG. 1B is a partial top view of the memory device.

Referring to FIG. 1A, an X-decoder 300 of a memory device is connected to a local select line LS to select a corresponding pass transistor 200, and then a voltage is passed to a local word line of a memory array 100 through the pass transistor 200 to perform an operation of the memory array.

Figure 3A:
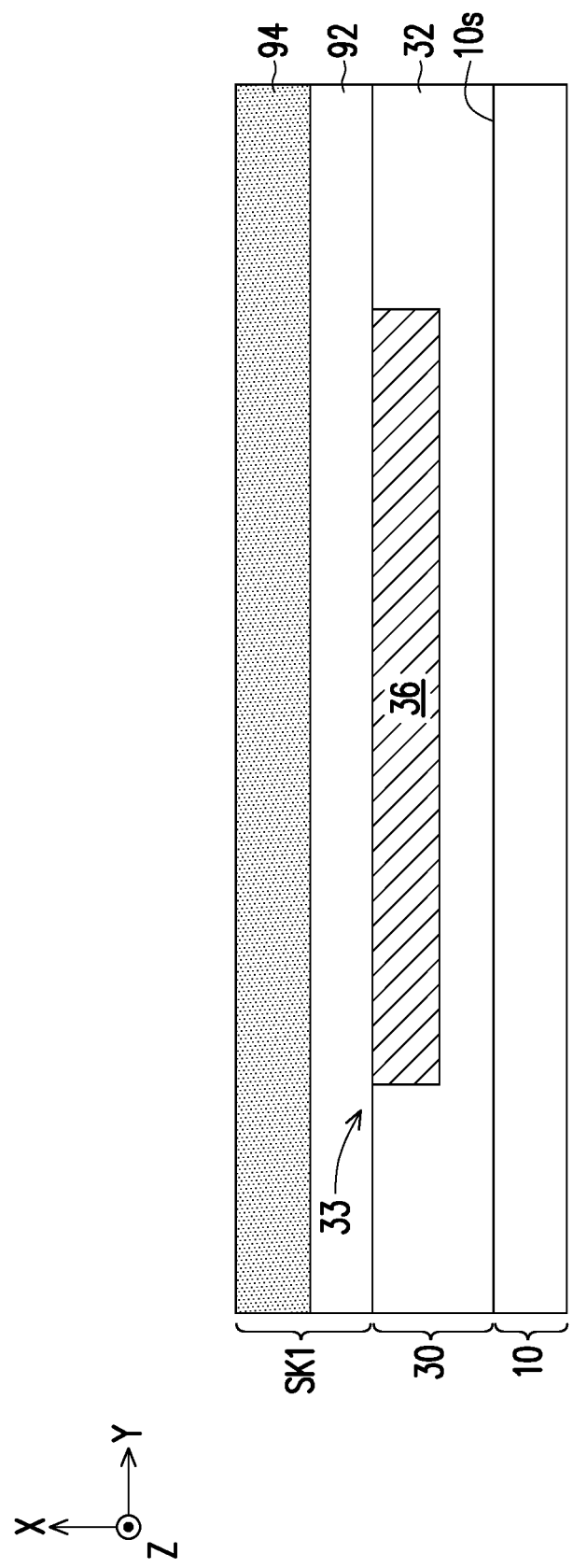
FIG. 3A to FIG. 3Q show schematic cross-sectional views of the fabrication process along line A-A' of FIG. 1B.
Figure 3B:
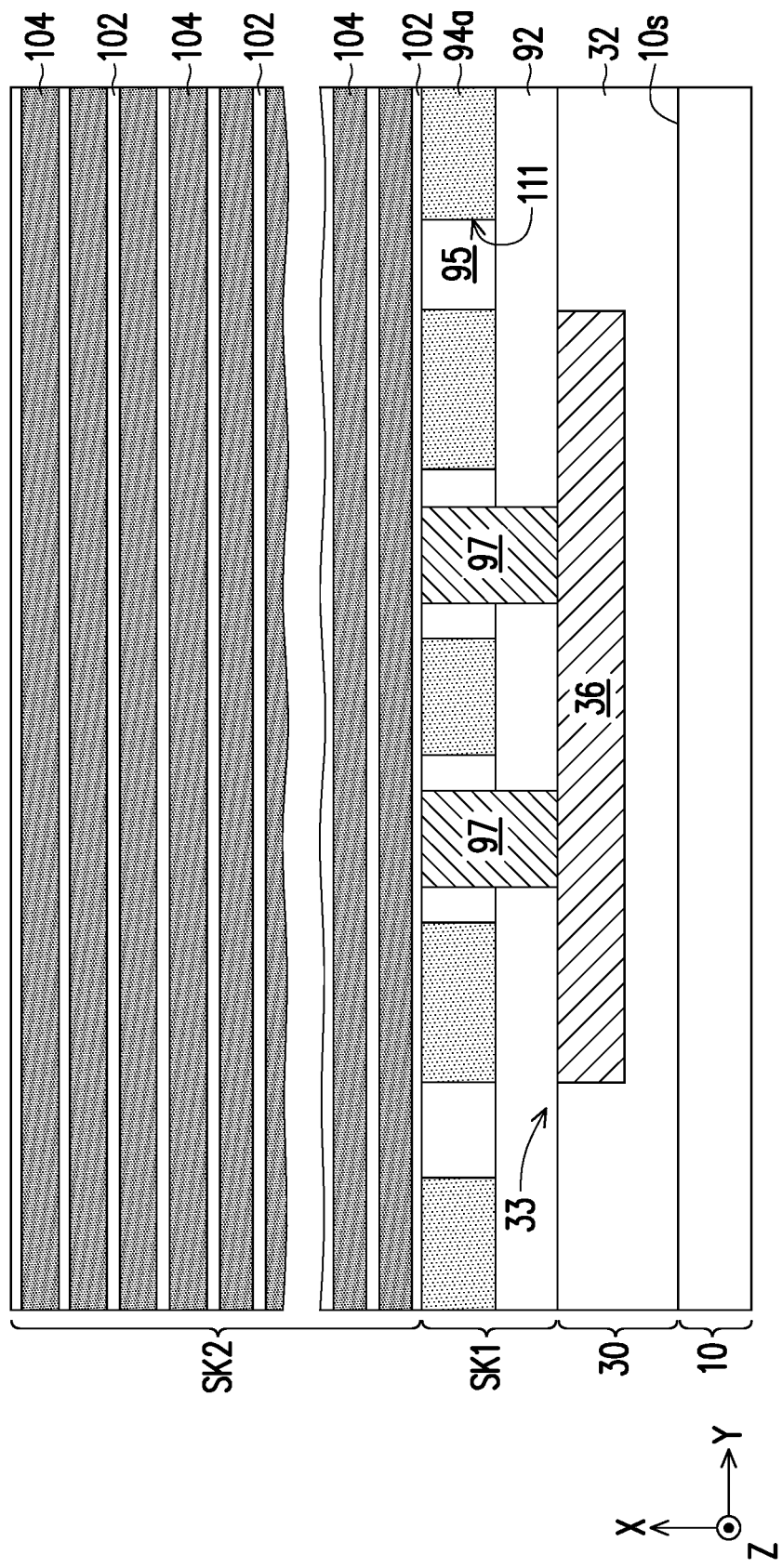
Figure 3C:
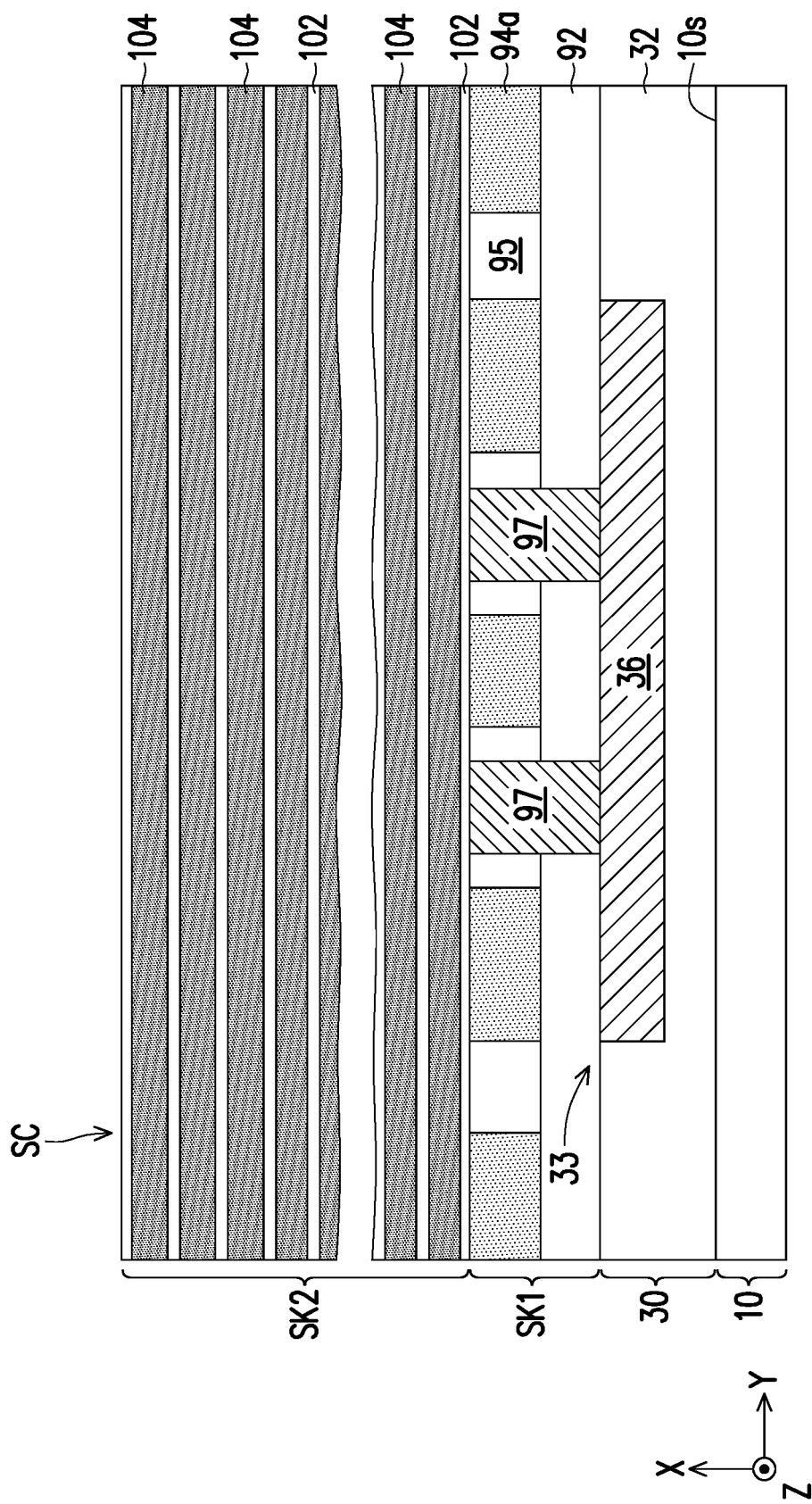
Figure 3D:
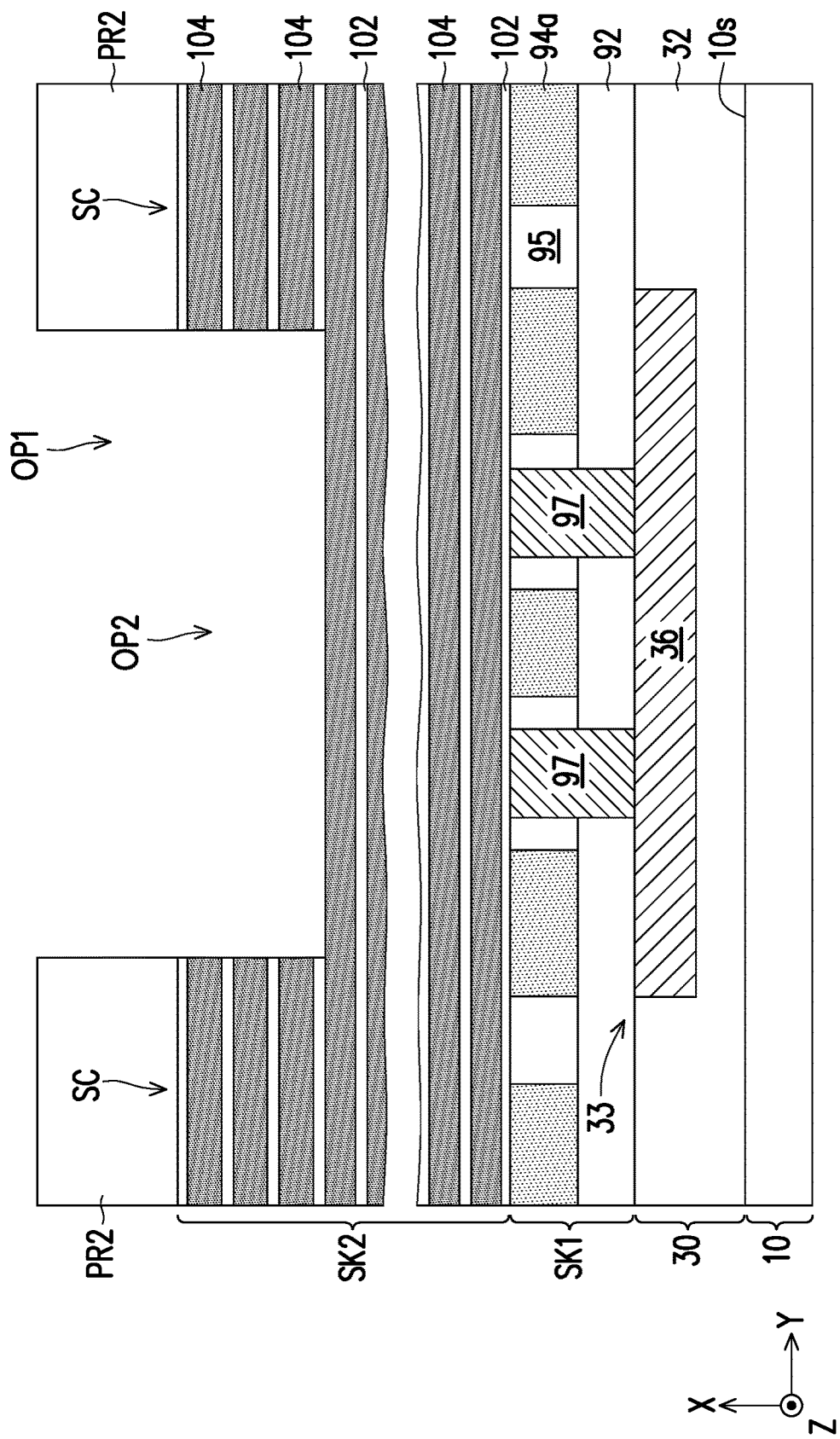
Figure 3E:
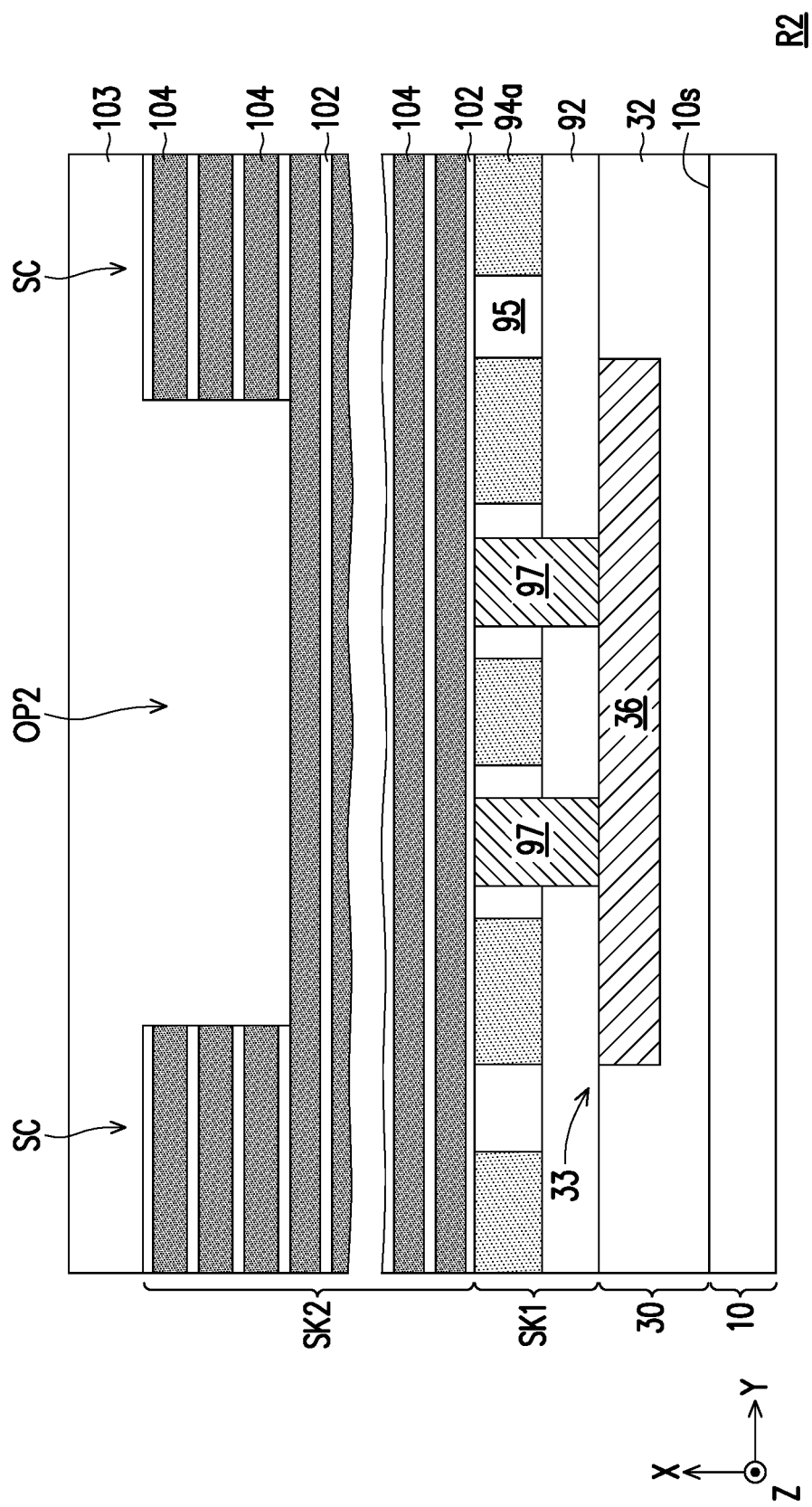
Figure 3F:
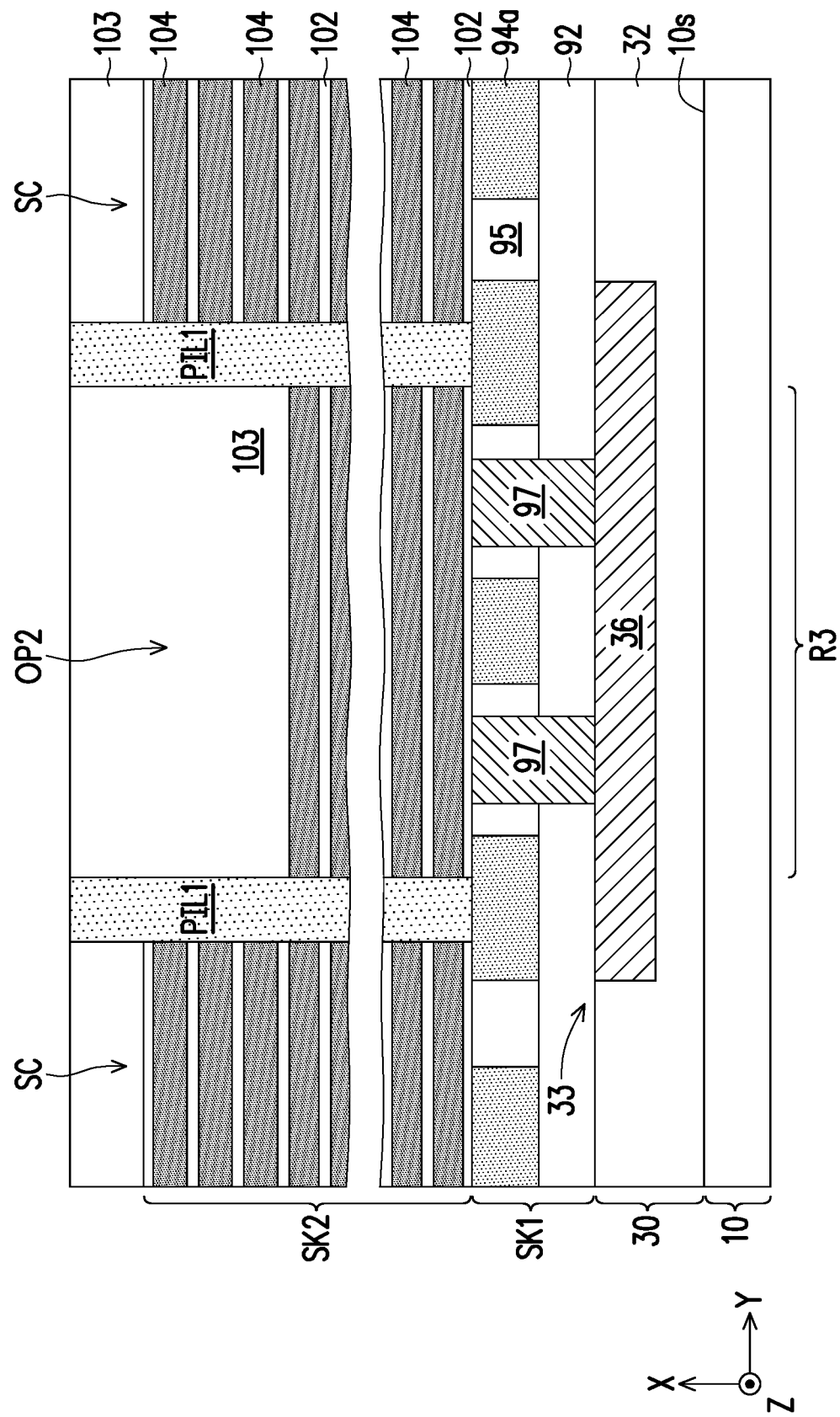
Figure 3G:
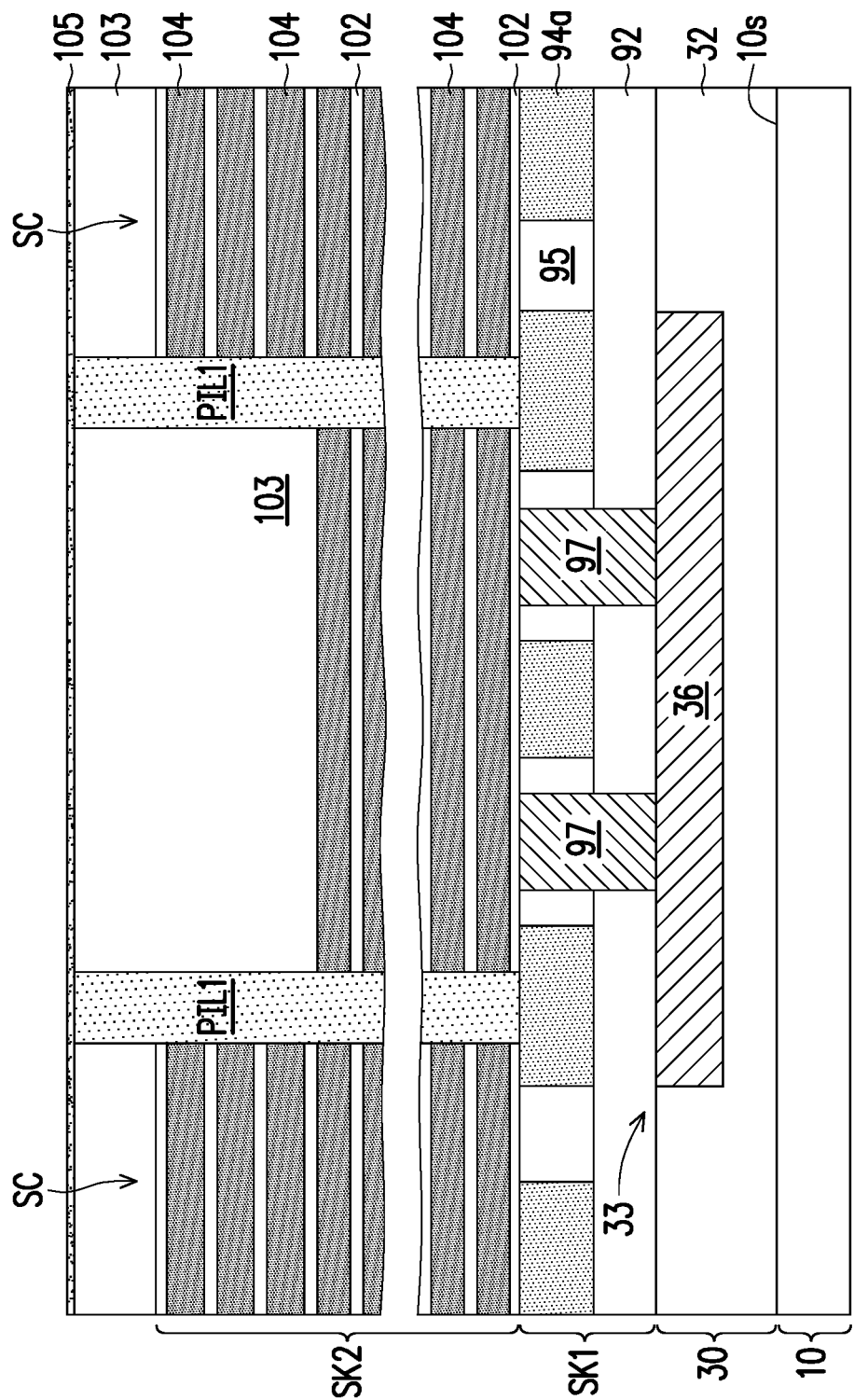
Figure 3H:
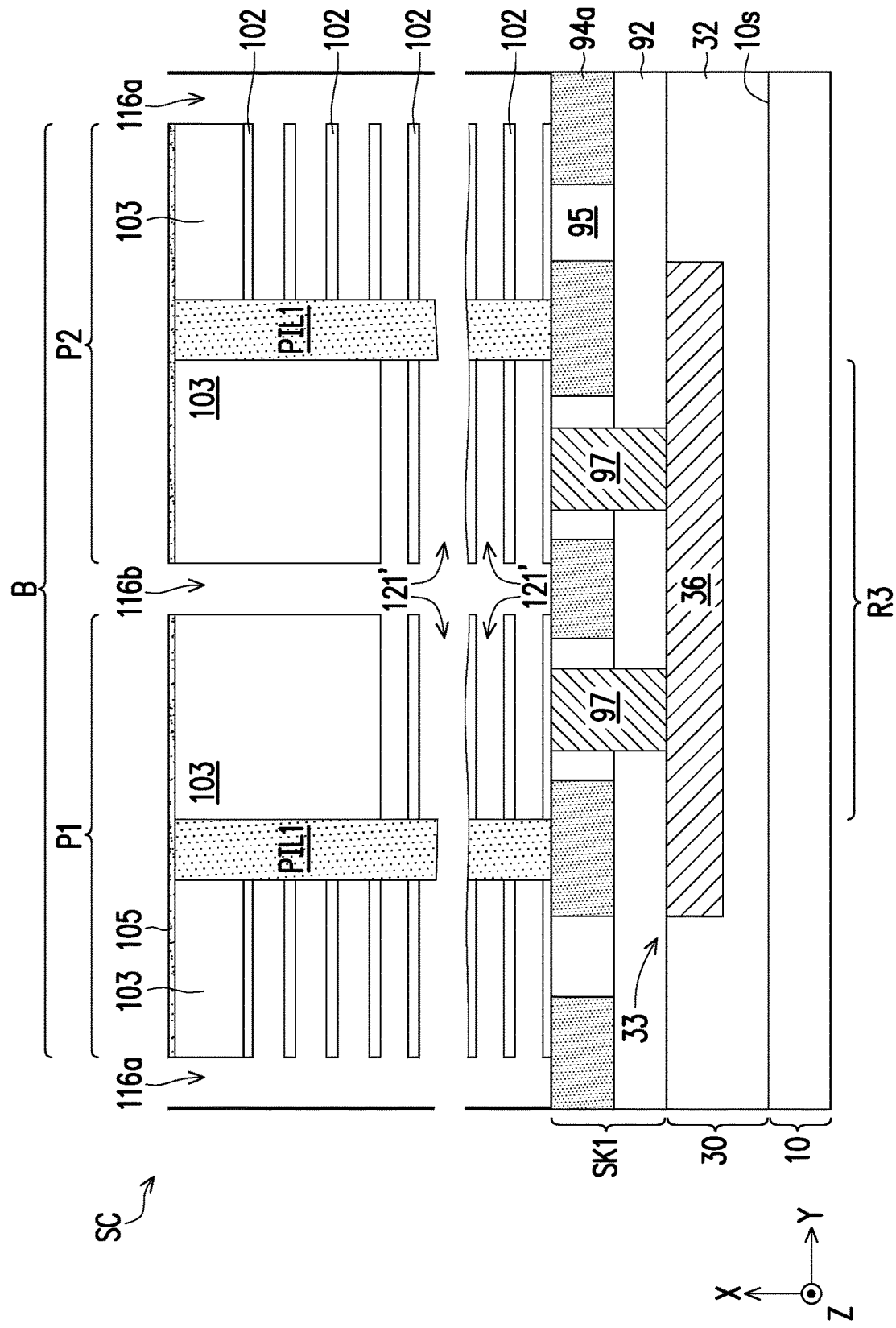
Figure 3I:
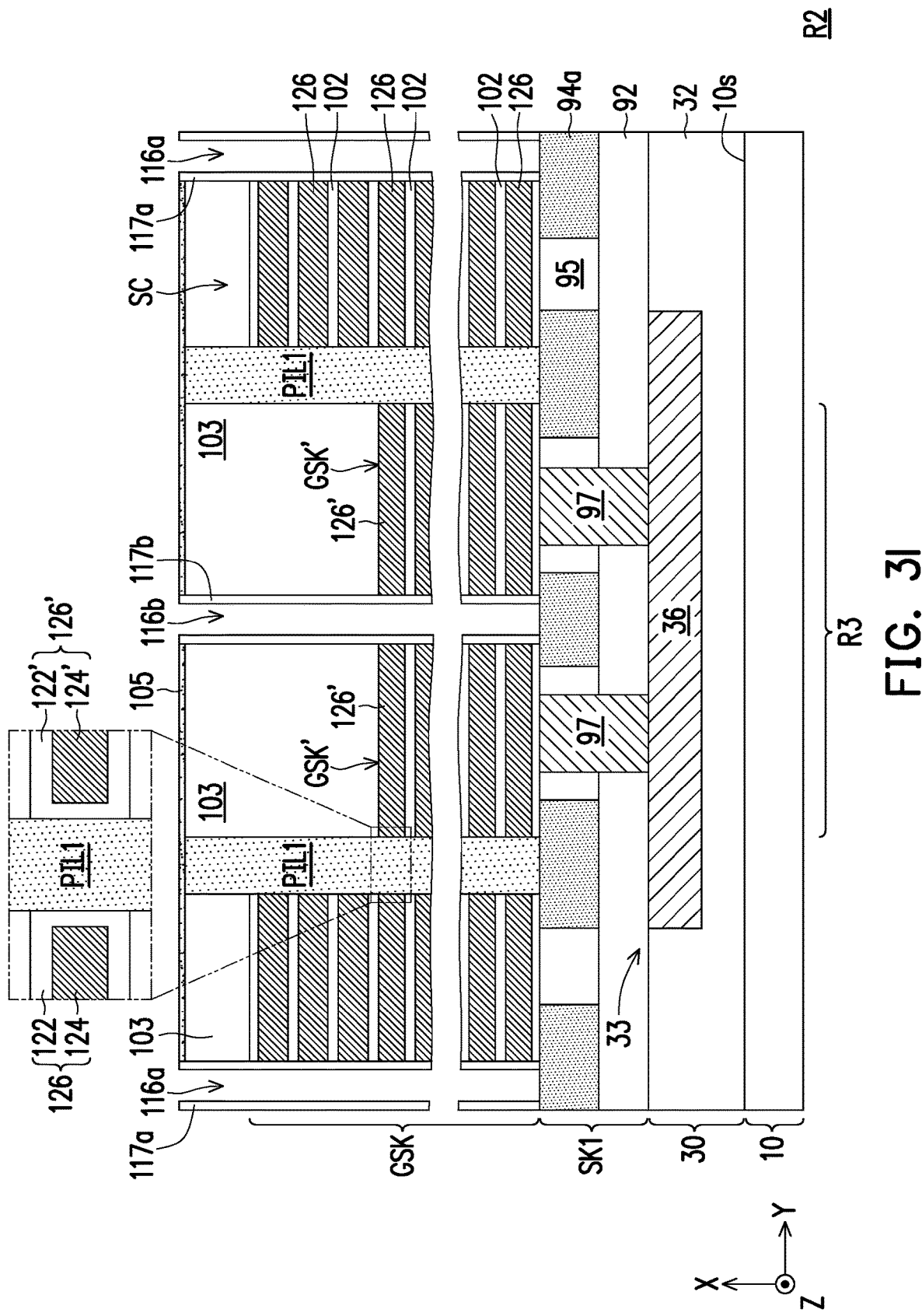
Figure 3J:
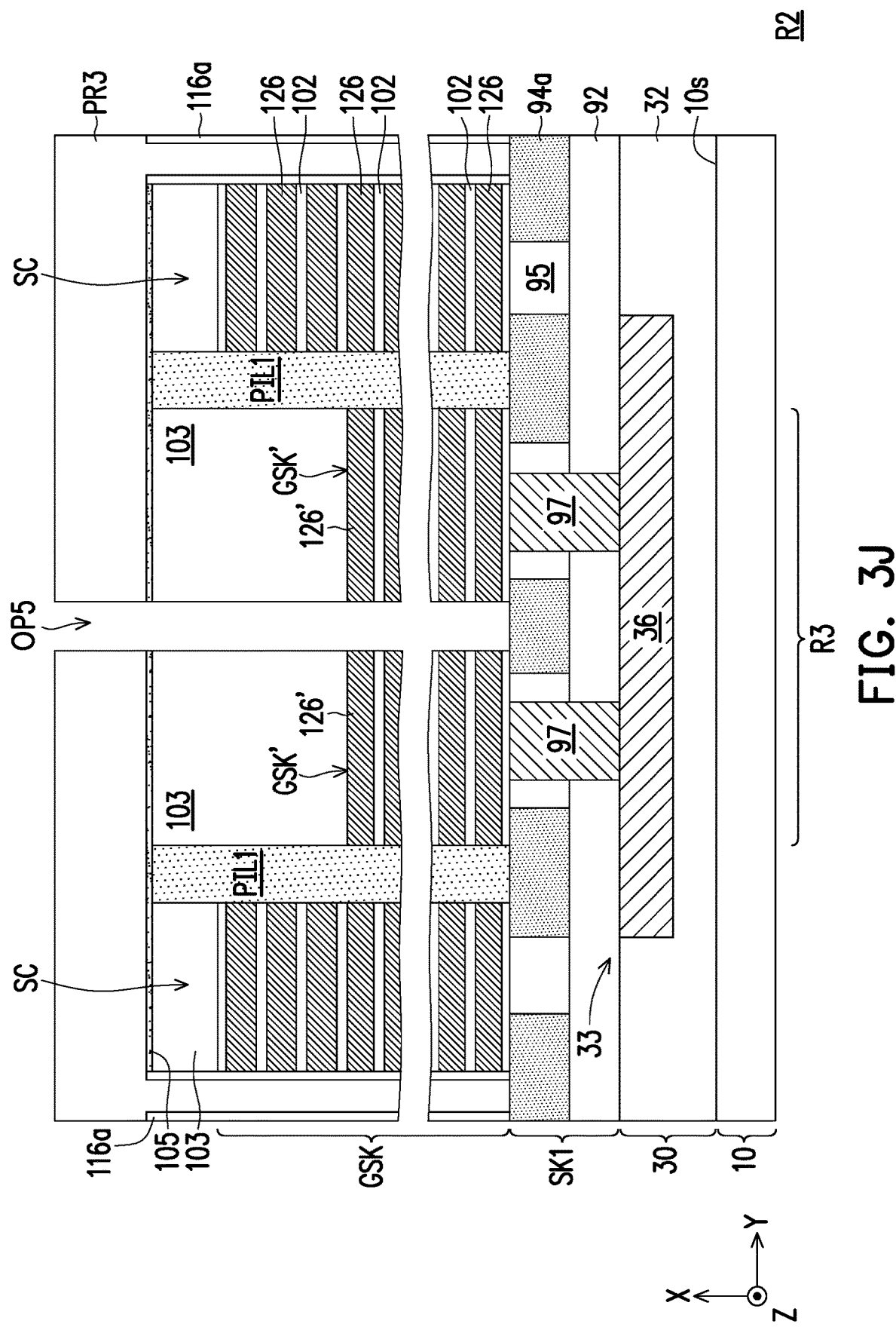
Figure 3K:
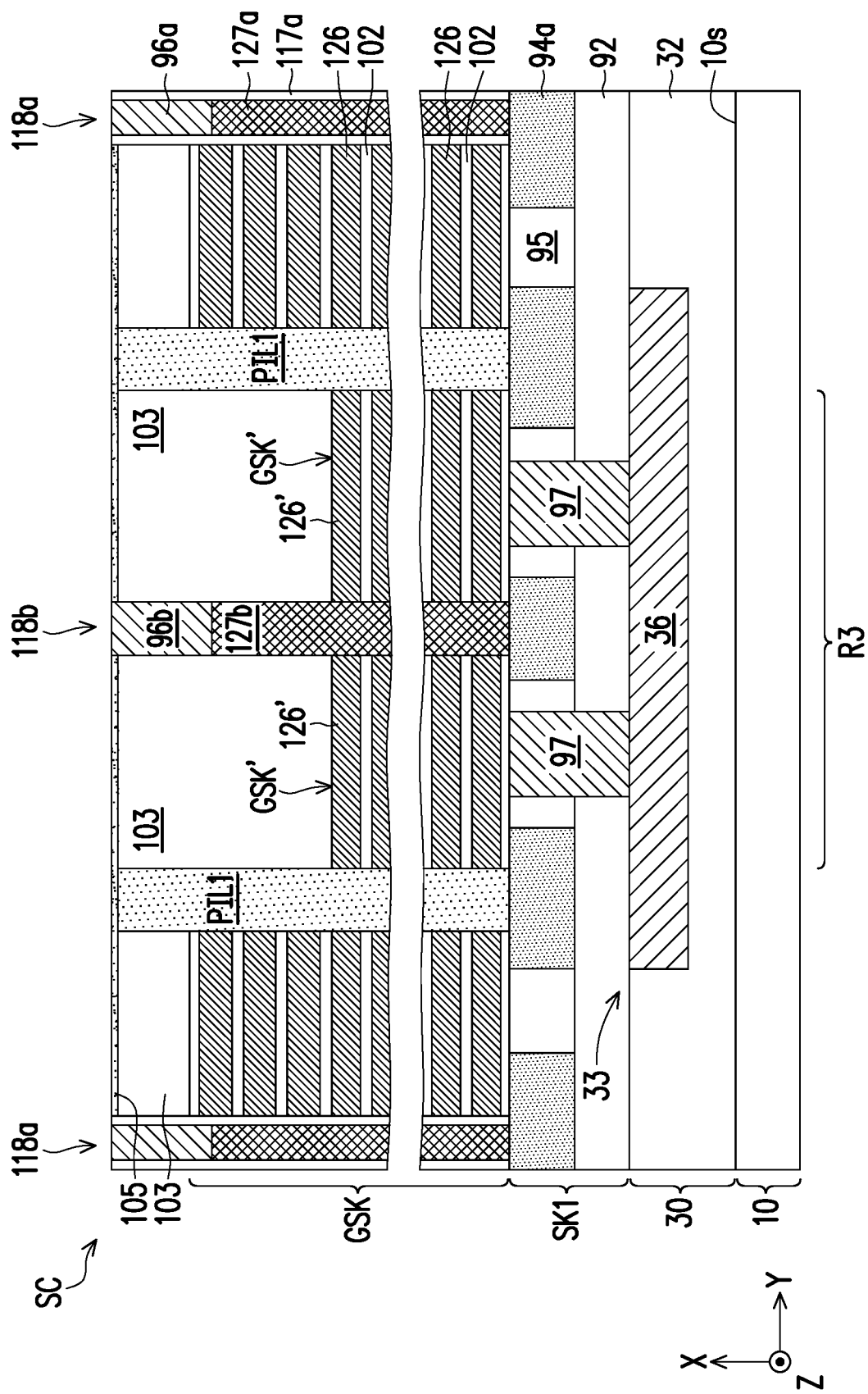
Figure 3L:
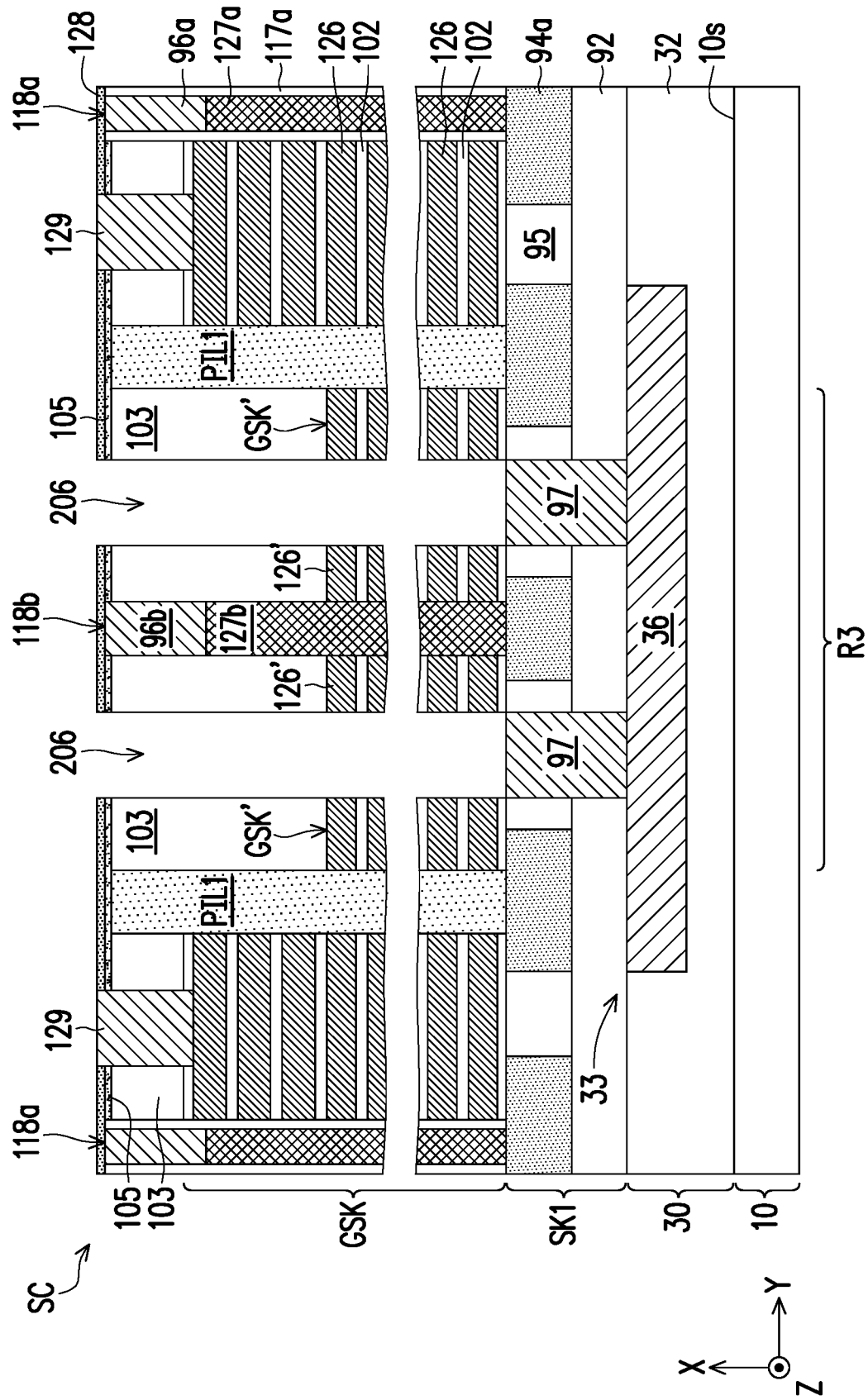
Figure 3M:
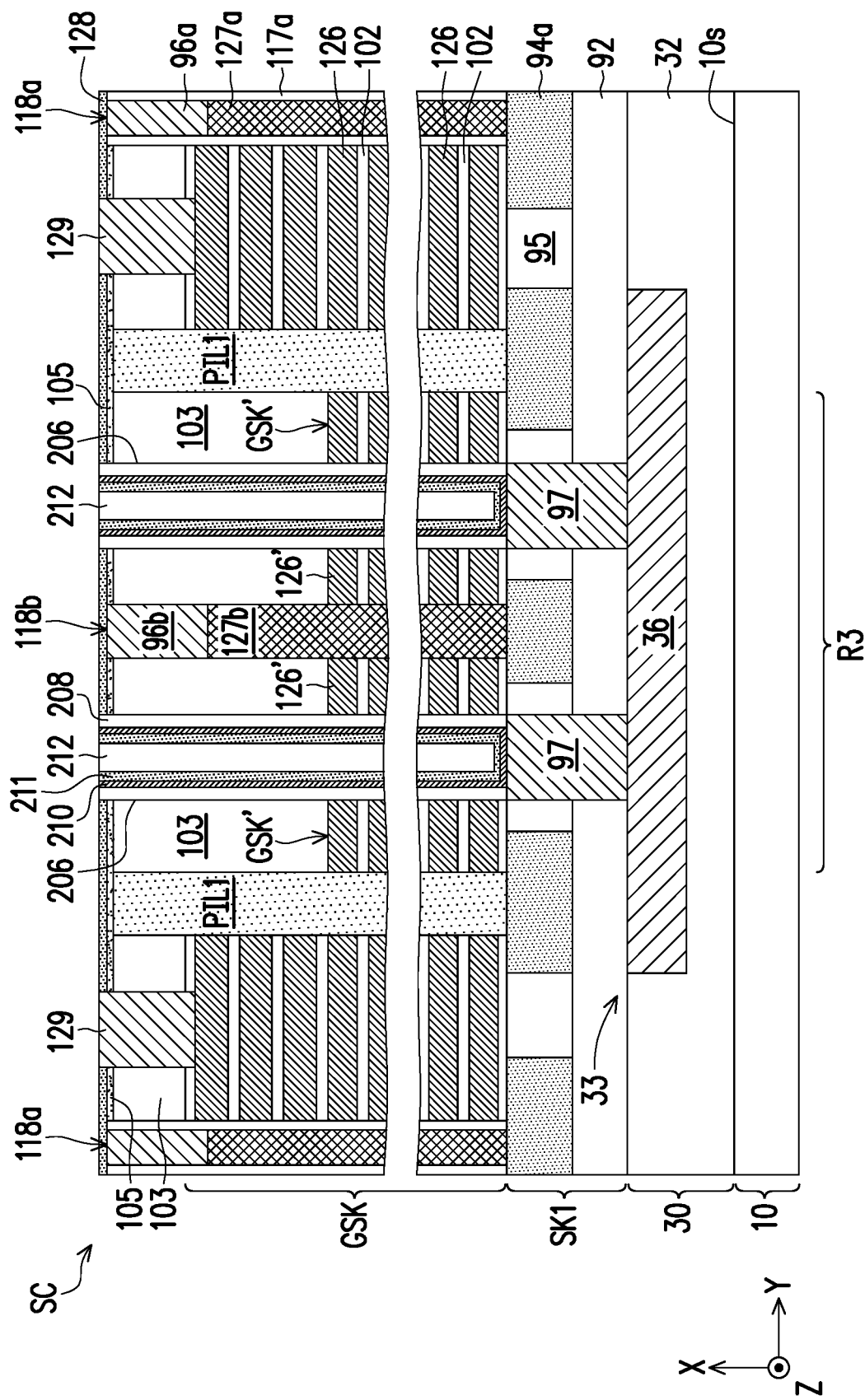
Figure 3N:
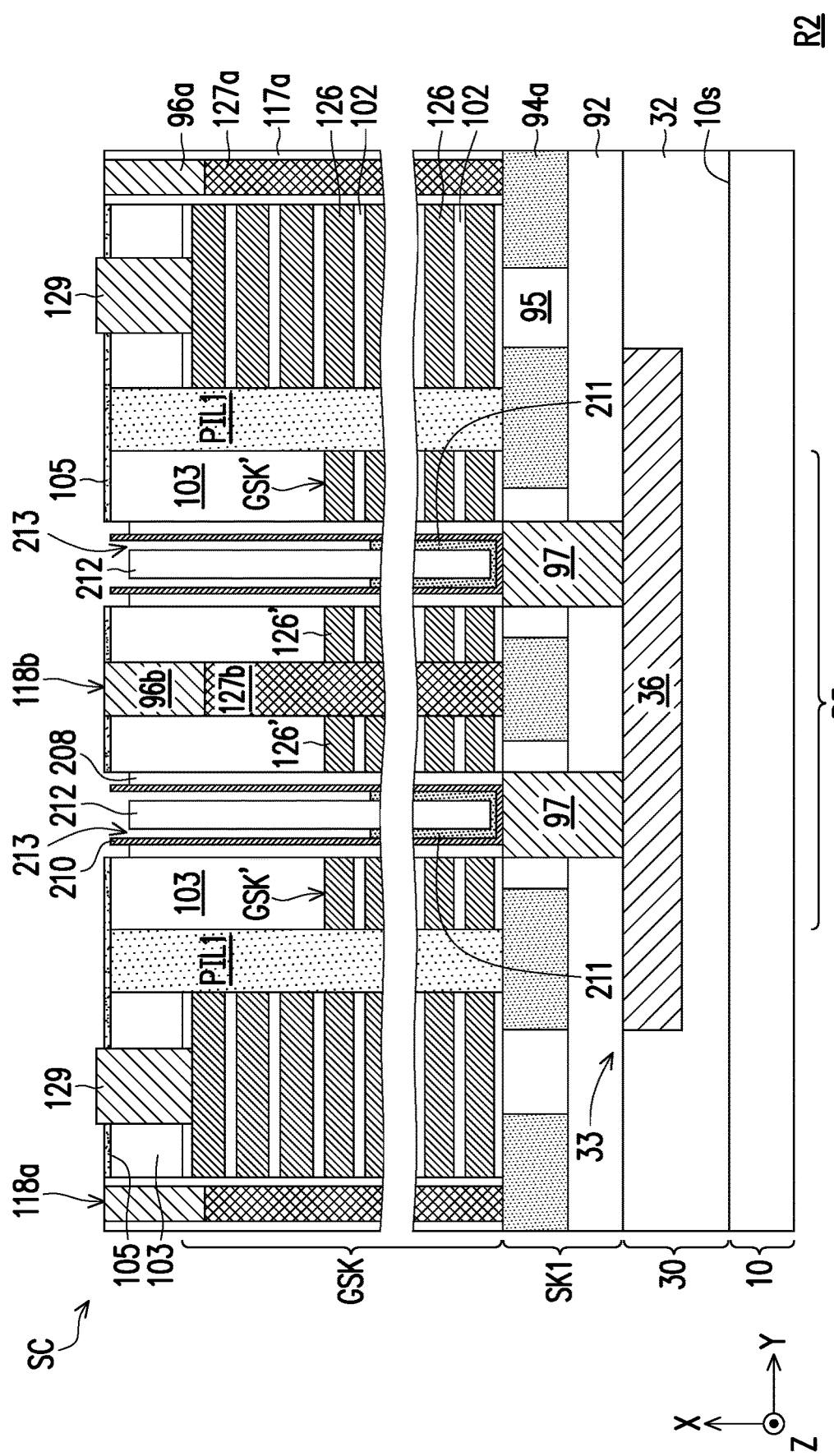
Figure 30:
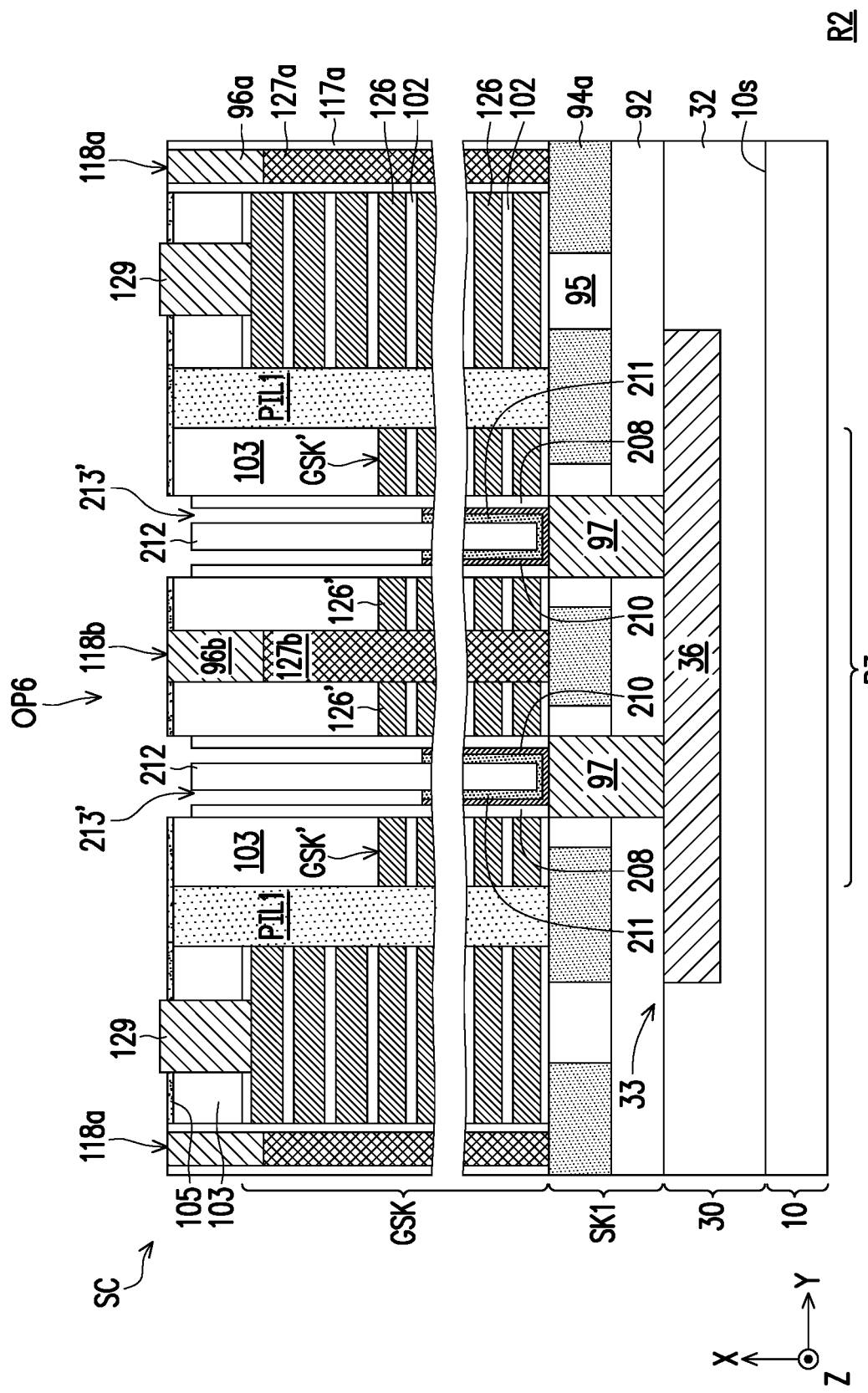
Figure 3P:
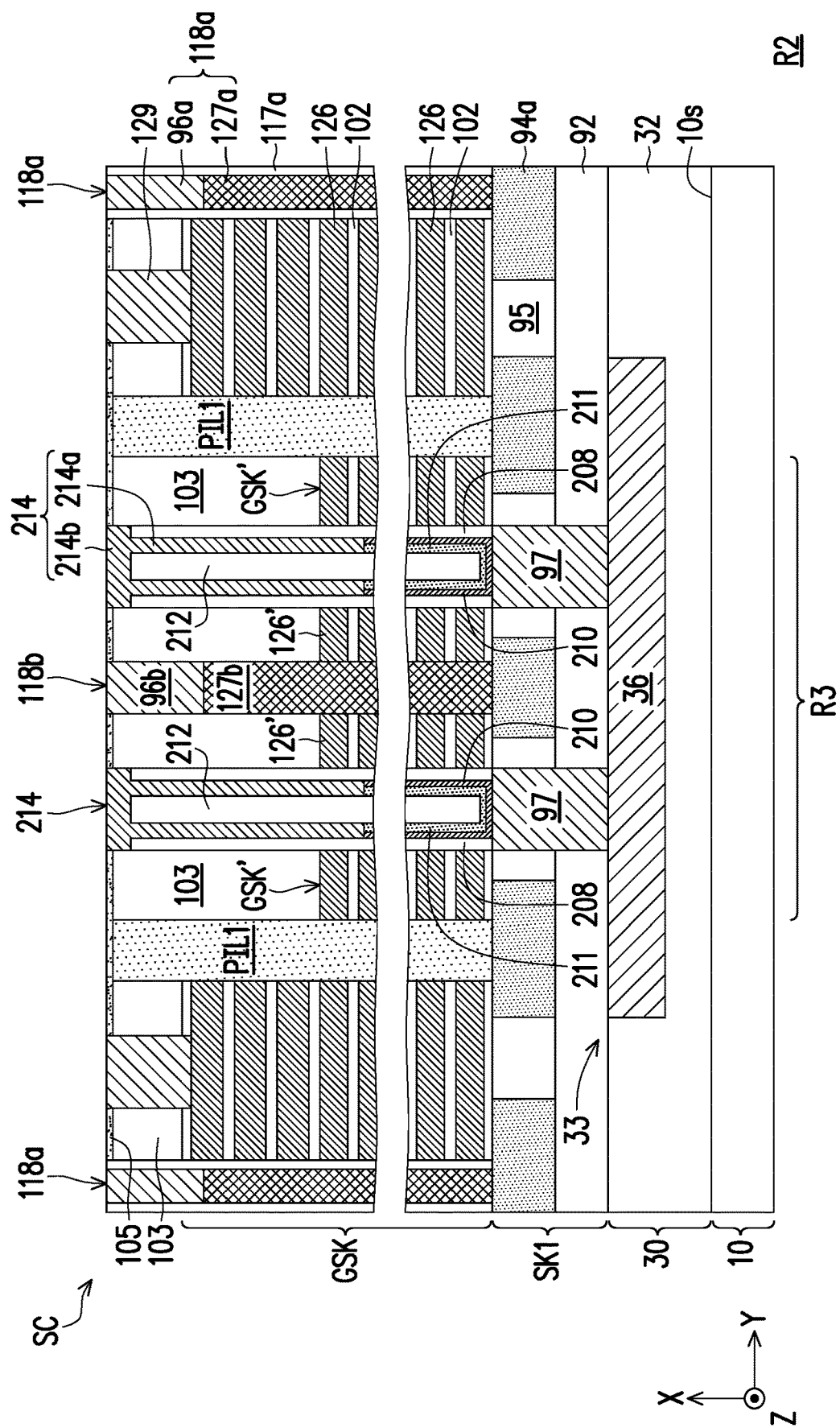
Figure 3Q:
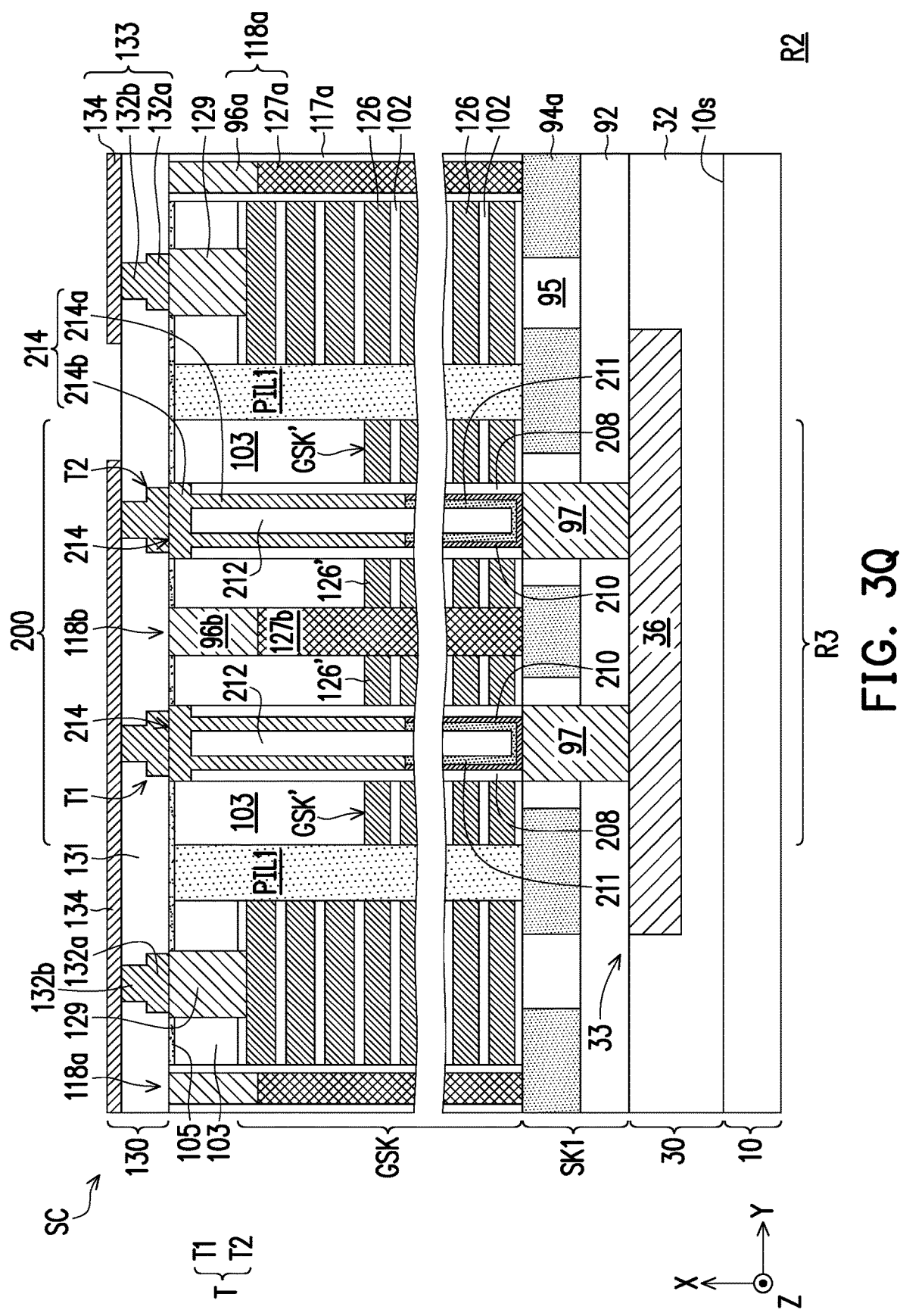

FIG. 3Q shows a schematic cross-sectional view along line A-A' of FIG. 1B. Referring to FIG. 1A, in an embodiment of the disclosure, a plurality of pass transistors 200 are disposed above a lower interconnect structure 30 (as shown in FIG. 3Q) and are laterally adjacent to the memory array 100. The pass transistor 200 is a vertical gate all around transistor (referred to as a vertical transistor) T. Compared with a planar transistor, since the vertical transistor T is disposed perpendicular to a surface 10s of a substrate 10 (shown in FIG. 3Q), the vertical transistor T occupies a smaller area than a planar transistor, and a distance between gates of two pass transistors 200 connected to two adjacent global word lines (e.g., $GWL_0$ and $GWL_1$ among $GWL_0$, $GWL_1$, $GWL_2$, ..., $GWL_n$) is small. Therefore, the required chip area may be significantly reduced.

Figure 2A:
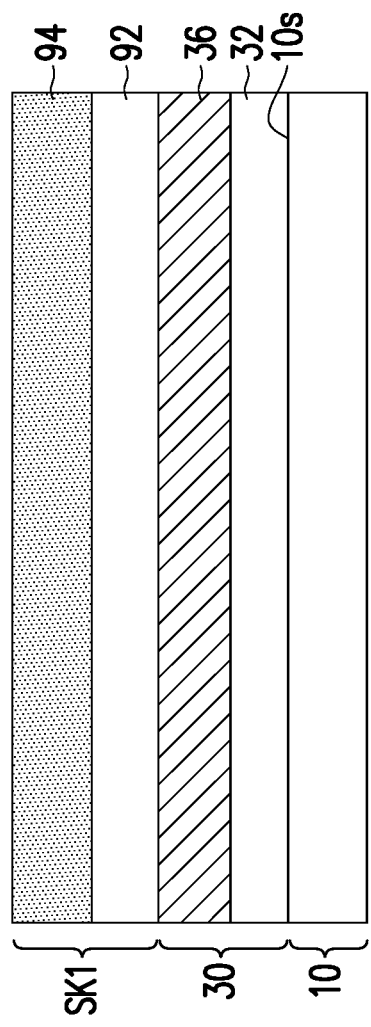
FIG. 2A to FIG. 2Q show schematic cross-sectional views of a fabrication process of the memory device.

Referring to FIG. 1B, FIG. 2A, and FIG. 3A, a substrate 10 is provided. FIG. 1B is a partial top view of the memory device. FIG. 2A to FIG. 2Q show schematic cross-sectional views of a fabrication process of the memory device. FIG. 3A to FIG. 3Q show schematic cross-sectional views of the fabrication process along line A-A' of FIG. 1B. The substrate 10 includes a first region R1 and a second region R2. The first region R1 and the second region R2 may also be referred to as a memory array region (or an array region) R1 and a staircase region R2. The substrate 10 may be a semiconductor substrate, such as a silicon-containing substrate. For simplicity, FIG. 1B does not show all of the first region R1, and some components are not shown.

A device layer (not shown) is formed on the substrate 10 (shown in FIG. 2A, and FIG. 3A). The device layer may include an active device or a passive device. The active device is, for example, a transistor, a diode, etc. The passive device is, for example, a capacitor, an inductor, etc. The transistor may be an N-type metal-oxide-semiconductor (NMOS) transistor, a P-type metal-oxide-semiconductor (PMOS) transistor, or a complementary metal-oxide-semiconductor (CMOS). For example, the device layer includes a page-buffer.

Referring to FIG. 2A, and FIG. 3A, an interconnect structure 30 is formed on the device layer. As illustrated in FIG. 3A, the interconnect structure 30 may include a plurality of dielectric layers 32 and an interconnect 33 formed in the dielectric layers 32. The interconnect 33 may be referred to as a first interconnect. The interconnect 33 includes a plurality of conductive plugs (not shown), a plurality of conductive lines 36, etc. The dielectric layer 32 separates adjacent conductive lines 36. The conductive lines 36 may be connected to each other through the plug, and the conductive lines 36 may be connected to the device layer through the conductive plugs. The interconnect structure 30 is located below subsequently formed gate stack structures GSK and GSK' (shown in FIG. 2Q and FIG. 3Q) and may thus be referred to as a lower interconnect structure 30. In some embodiment, the substrate 10 and the dielectric layers 32 may also be referred to as a dielectric substrate.

Referring to FIG. 2A and FIG. 3A, a stack structure SK1 is formed on the interconnect structure 30. The stack structure SK1 includes an insulator layer 92 and a conductive layer 94 on the insulator layer 92. In an embodiment, the material of the insulator layer 92 includes silicon oxide, and the material of the conductive layer 94 includes doped polysilicon. The numbers of the insulator layer 92 and the conductive layer 94 are not limited to those shown in the figures. Since a memory array will be formed right above the stack structure SK1 in the first region R1, and the device layer is, for example, a complementary metal-oxide-semiconductor (CMOS) formed below the memory array. This architecture may also be referred to as a CMOS-Under-Array (CUA) structure.

Referring to FIG. 1B and FIG. 3B, the conductive layer 94 is patterned to form a patterned conductive layer 94a having grooves 111 in the second region R2. Next, an insulating material (e.g., silicon oxide) is filled in the grooves 111, and a chemical-mechanical planarization process is performed to remove the excessive insulating material to form insulating structures 95 in the grooves 111. In other some embodiments, the conductive layer 94a and the insulating structures 95 may be formed by a damascene process.

Referring to FIG. 3B, lithography and etching processes are performed to form via openings (not shown) in the insulating structures 95 and the insulator layer 92. The via opening is, for example, a hole or a trench. The via opening exposes the surface of the conductive line 36. The etching process is, for example, a dry etching process, a wet etching process, or a combination thereof. The shape of the via opening may be a cylinder, an elliptic cylinder, a cuboid, etc. and is not particularly limited.

Referring to FIG. 3B, next, a conductive plug 97 is formed in the via opening. The material of the conductive plug 97 includes, for example, tungsten or copper. The method of forming the conductive plug 97 includes, for example, forming a conductive material on the stack structure SK1 and in the via opening, and then performing a planarization process such as an etch-back process or a chemical-mechanical polishing process to remove the excessive conductive material on the stack structure SK1. The conductive plug 97 is electrically connected to the topmost conductive line 36. In some embodiments, the topmost conductive line 36 electrically connected to the conductive plug 97 may serve as a global word line.

Figure 2B:
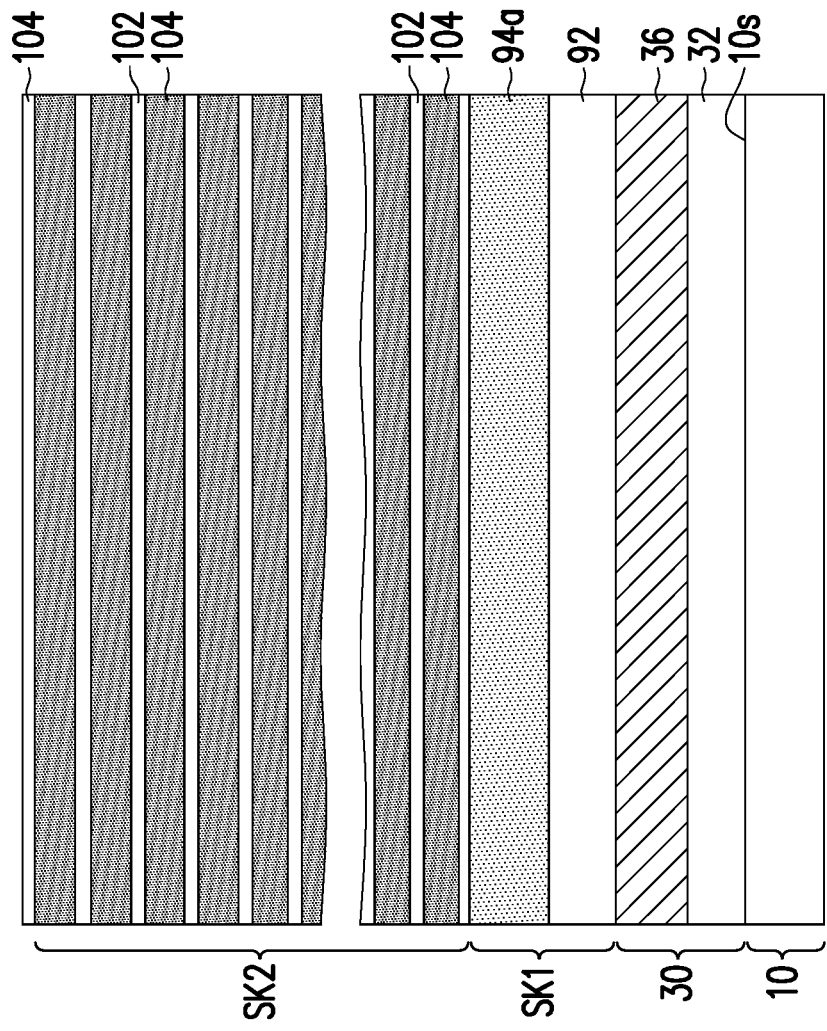

Referring to FIG. 2B and FIG. 3B, next, a stack structure SK2 is formed over the substrate 10. The stack structure SK2 includes a plurality of insulating layers 102 and a plurality of middle layers 104 stacked alternately with each other. In an embodiment, the material of the insulating layer 102 includes silicon oxide, and the material of the middle layer 104 includes silicon nitride. The middle layers 104 may serve as sacrificial layers and may be partially removed or completely removed in a subsequent process. In some embodiments, the stack structure SK1 may be referred to as a first stack structure SK1, and the stack structure SK2 may be referred to as a second stack structure SK2. The insulator layer 92 of the stack structure SK1 may be referred to as a first insulating layer 92, and the insulating layer 102 of the stack structure SK2 may be referred to as a second insulating layer 102.

Figure 2C:
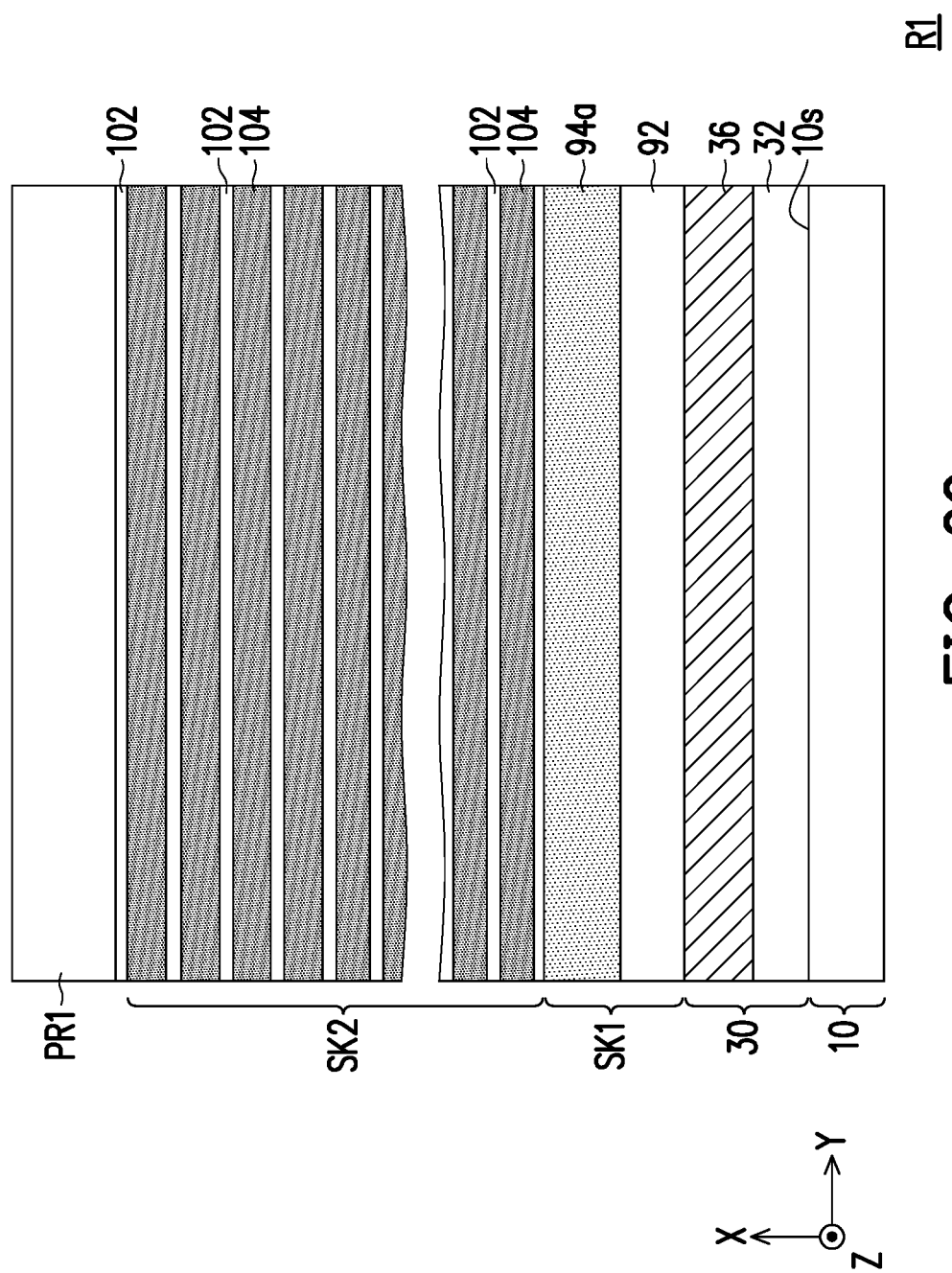

Referring to FIG. 2C, and FIG. 3C, a mask layer PR1 is formed on the stack structure SK2 to cover the first region R1 and expose the second region R2. The stack structure SK2 in the second region R2 is patterned to remove a portion of the insulating layers 102 and a portion of the middle layers 104 and to form a staircase structure SC. Therefore, the number of the insulating layers 102 and the number of the middle layers 104 of the staircase structure SC in the second region R2 is less than the number of the insulating layers 102 and the number of the middle layers 104 of the stack structure SK2 in the first region R1. A top surface of the staircase structure SC in the second region R2 is lower than a top surface of the stack structure SK2 in the first region R1. In some embodiments, the staircase structure SC may be formed through a multi-stage patterning process, but the disclosure is not limited thereto. The patterning process may include processes such as lithography, etching, and trimming.

Figure 2D:
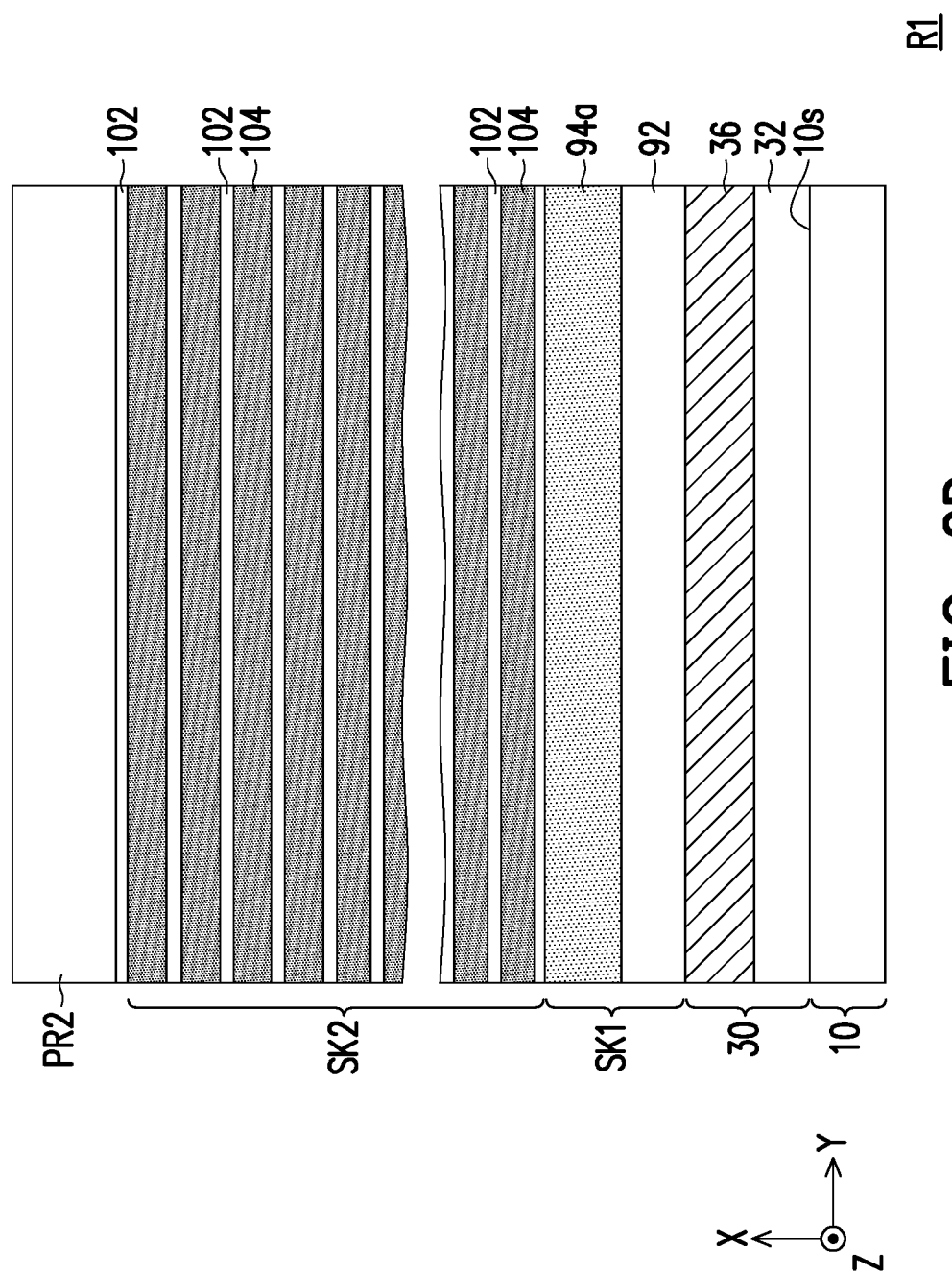

Referring to FIG. 2D and FIG. 3D, the mask layer PR1 is removed. A mask layer PR2 having an opening OP1 is formed to cover the stack structure SK2 in the first region R1 and a portion of the staircase structure SC in the second portion R2. The mask layer PR2 has an opening OP1 and the opening OP1 exposes another portion of the staircase structure SC in the second region R2. The staircase structure SC in the second region R2 is patterned to remove the another portion of the staircase structure SC exposed by the opening OP1 and to form an opening OP2. The number of the remaining middle layers 104 below the opening OP2 is related to the number of gates of pass transistors to be formed. In FIG. 3D, although multiple middle layers 104 are remained below the opening OP2, but the present disclosure is not limited thereto. In some embodiments, only one middle layer 104 below the opening OP2 is remained to be used to form a single gate of a pass transistor.

Figure 2E:
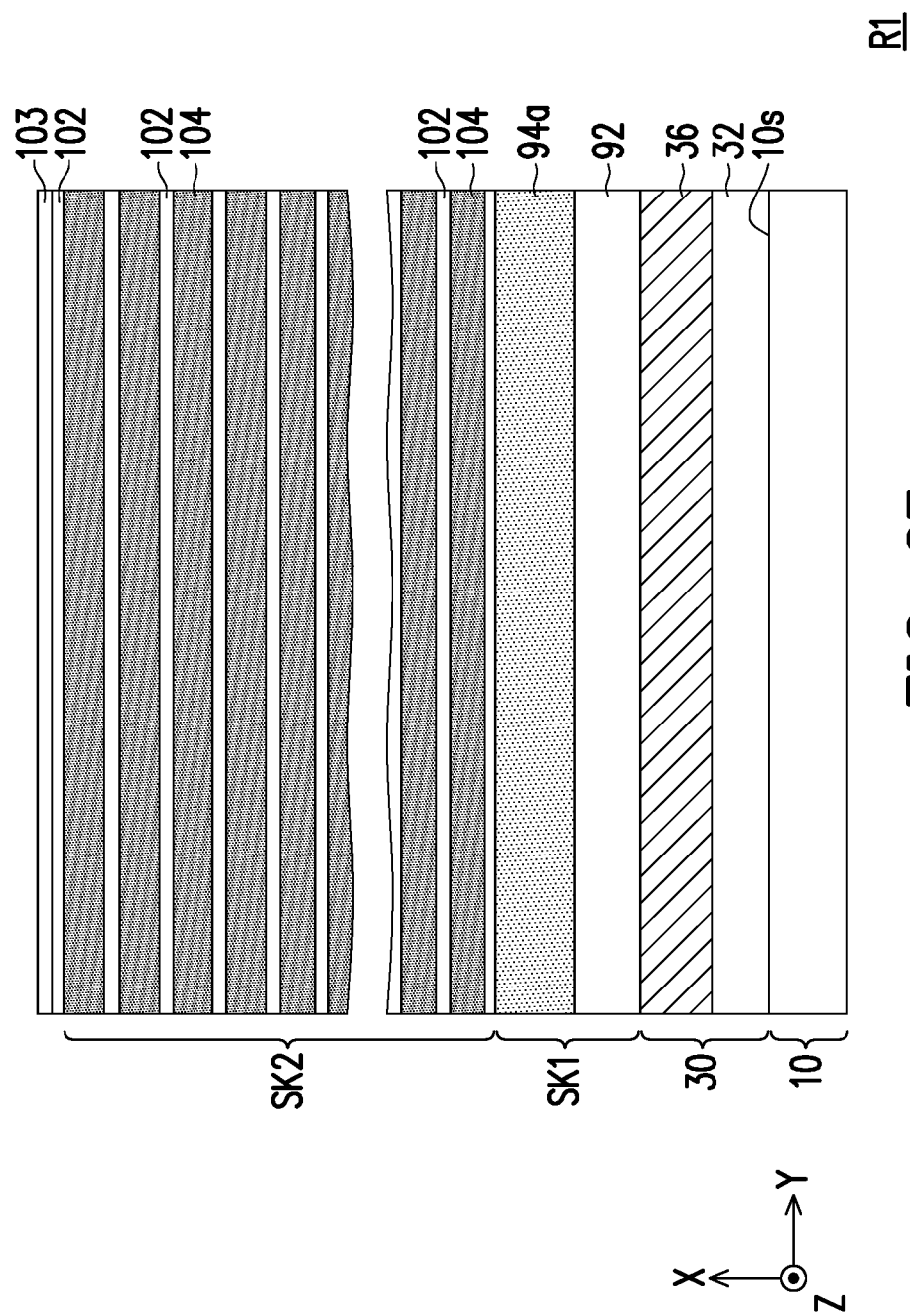

Referring to FIG. 2E and FIG. 3E, the mask layer PR2 is removed. A dielectric layer 103 is formed over the substrate 10 to cover the staircase structure SC and fill in the opening OP2. The material of the dielectric layer 103 includes, for example, silicon oxide. The method of forming the dielectric layer 103 includes, for example, forming a dielectric material to cover the staircase structure SC and fill in the opening OP2. Afterwards, a planarization process such as a chemical-mechanical polishing process is performed to remove part of the dielectric material to form the dielectric layer 103 with a top surface higher than a top surface of the stack structure SK2 in the first region R1 and the top surface of the staircase structure SC in the second region R2. A thickness of the dielectric layer 103 on the staircase structure SC in the second region R2 is greater than a thickness of the dielectric layer 103 on the stack structure SK2 in the first region R2 because the top surface of the staircase structure SC in the second region R2 is lower than the top surface of the stack structure SK2 in the first region R1.

Figure 2F:
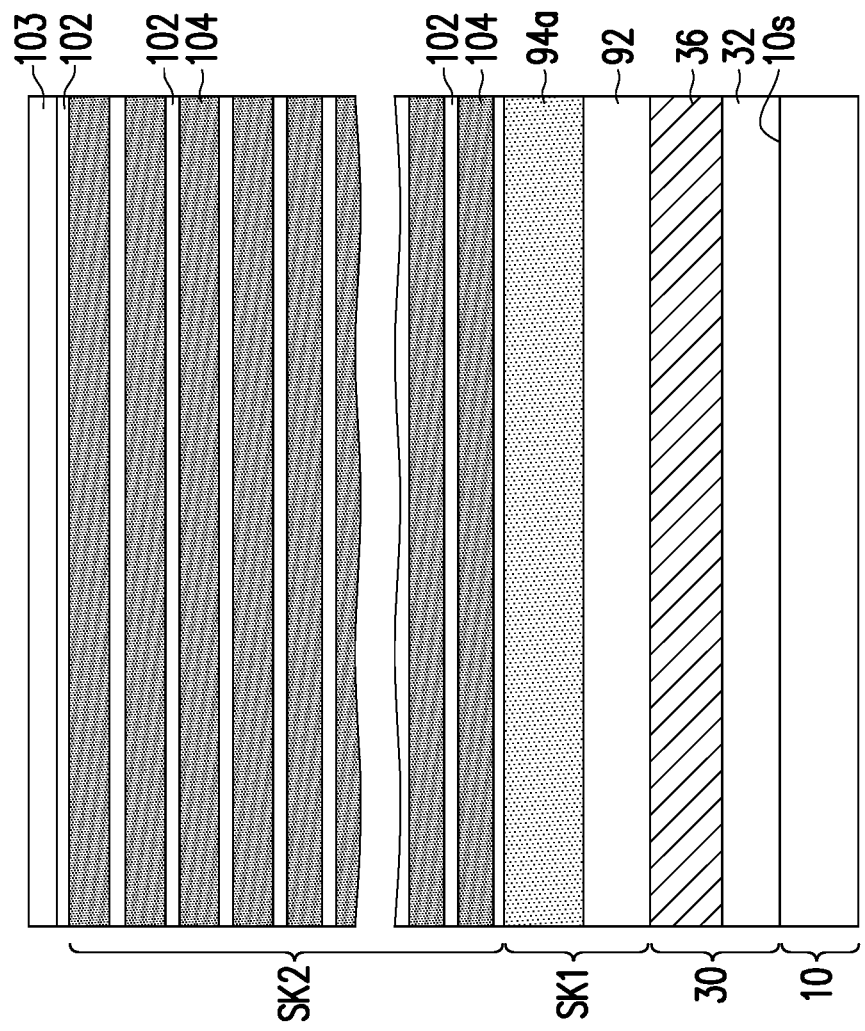

Referring to FIG. 1B, FIG. 2F, and FIG. 3F, an insulating slit PIL1 (shown in FIG. 1B and FIG. 3F) and insulating pillars PIL2 (shown in FIG. 1B) are formed. The insulating slit PIL1 are formed extending through the dielectric layer 103 and the staircase structure SC in the second region R2, and may be subsequently used to electrically isolate the word lines of the memory array and the gates of the pass transistors to be formed. A third region R3 surrounded by the insulating slit PIL1 in the second region R2 may also be referred to as a pass transistor region. As illustrated in FIG. 1B, the insulating pillars PIL2 are formed extending through the dielectric layer 103 and the stack structure SK2 in the first region R1, and the dielectric layer 103 and the staircase structure SC in the second region R2. The insulating pillars PIL2 may serve as support pillars in a subsequent fabrication process.

In one embodiment, a formation method of the insulating slit PIL1 and the insulating pillars PIL2 is described below. As shown in FIG. 1B, a trench OP3 is formed in the dielectric layer 103 and the staircase structure SC in the second region R2, and a plurality of openings OP4 are formed in the dielectric layer 103 and the stack structure SK2 and the staircase structure SC in the first region and the second region R2 through lithography and etching processes. The trenches OP3 and the openings OP4 may expose the bottommost insulating layer 102 of the stack structure SK2 or expose the conductive layer 94 of the stack structure SK1. Next, an insulating material is formed on the dielectric layer 103 and filled in the trench OP3 and the openings OP4. Afterwards, a planarization process, such as a chemical-mechanical polishing process, is performed to remove part of the insulating material above the top surface of the dielectric layer 103.

Figure 2G:
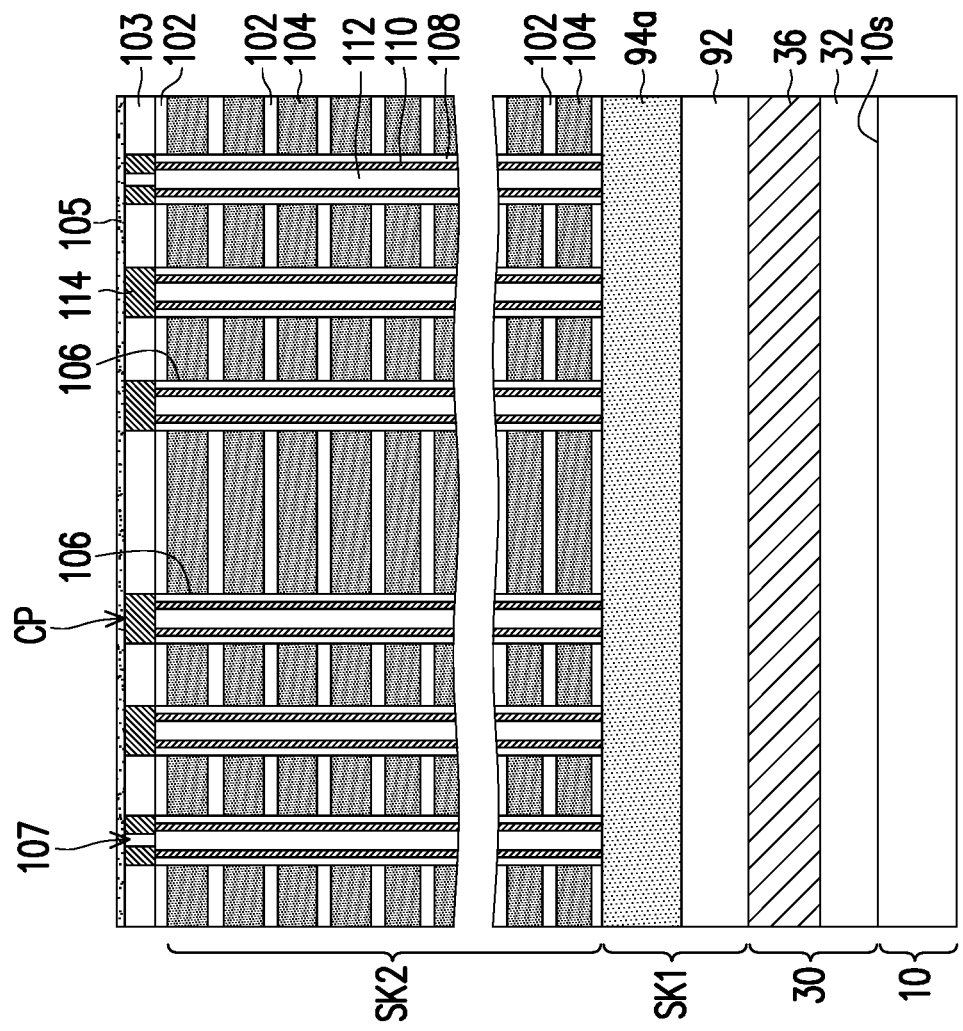

Referring to FIG. 2G and FIG. 3G, a patterning process is performed to remove part of the dielectric layer 103, part of the stack structure SK2 and part of the stack structure SK1 in the first region R1 to form one or more openings 106 passing through the stack structure SK2 (as shown in FIG. 2G). In an embodiment, the opening 106 may have a substantially vertical sidewall, as shown in FIG. 2G. In another embodiment, the opening 106 may have a slightly inclined sidewall (not shown). In an embodiment, the opening 106 is also referred to as a vertical channel (VC) opening. Next, a vertical channel pillar CP is formed in the opening 106. The vertical channel pillar CP may be formed by a method described below.

First, referring to FIG. 2G again, a charge storage structure 108 is formed on the sidewall of the opening 106. The charge storage structure 108 is in contact with sidewalls of the insulating layers 102, the middle layers 104 and a top surface of the patterned conductive layer 94a. The charge storage structure 108 may include a tunneling layer, a storage layer, and a blocking layer. The material of the tunneling layer is, for example, silicon oxide. The storage material is, for example, silicon nitride. The blocking material is, for example, silicon oxide or a high dielectric constant material having a dielectric constant greater than or equal to 7, such as aluminum oxide ($Al_2O_3$), hafnium oxide ($HfO_2$), lanthanum oxide ($La_2O_5$), transition metal oxide, lanthanide oxide, or combinations thereof. In an embodiment, the charge storage structure 108 is a silicon oxide/silicon nitride/silicon oxide (ONO) composite layer. The charge storage structure 108 is formed on the sidewall of the opening 106 in the form of a spacer and exposes the bottom surface of the opening 106.

Next, referring to FIG. 2G again, a channel layer 110 is formed on the charge storage structure 108. In an embodiment, the material of the channel layer 110 includes, for example, polysilicon. In an embodiment, the channel layer 110 covers at least an internal surface of the charge storage structure 108 on the sidewall of the opening 106, and also covers the top surface of patterned conductive layer 94a exposed by the opening 106. Next, an insulating pillar 112 is formed at a center portion of the opening 106. In an embodiment, the material of the insulating pillar 112 includes silicon oxide. Afterwards, a conductive plug 114 is formed through the dielectric layer 103 and is in contact with the channel layer 110. In an embodiment, the material of the conductive plug 114 includes polysilicon. The channel layer 110, the insulating pillar 112, and the conductive plug 114 may be collectively referred to as a vertical channel pillar CP. The charge storage structure 108 surrounds the vertical outer surface of the vertical channel pillar CP.

Next, referring to FIG. 2G, selective source line cut slits 107 extending in the X direction is formed in part of the dielectric layer 103 and part of the conductive plug 114 of each block B. The selective source line cut slits 107 includes an insulating material, such as silicon oxide.

Afterwards, referring to FIG. 2G and FIG. 3G again, a stop layer 105 is formed over the substrate 10 to cover, the vertical channel pillar CP, the insulating slit PIL1, the insulating pillars PIL2, and the dielectric layer 103. The material of the stop layer 105 is different from the materials of the insulating layer 102 and the middle layer 104 and includes, for example, aluminum oxide.

Figure 2H:
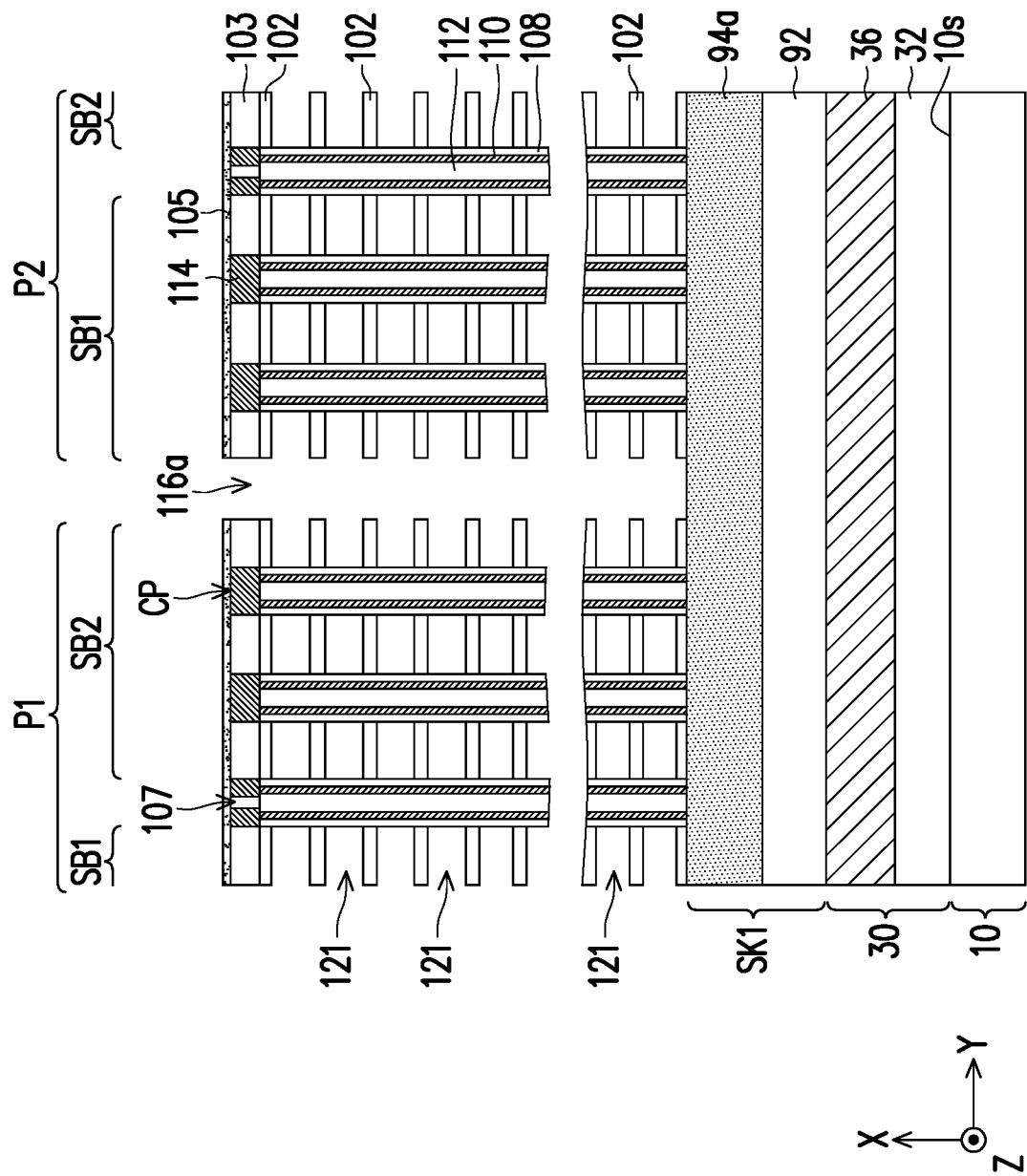

Referring to FIG. 1B, FIG. 2H and FIG. 3H, a patterning process is performed on the stack structure SK2 to form a plurality of trenches 116a and 116b. The trenches 116a and 116b extend in the X direction and pass through the dielectric layer 103 and the stack structure SK2. In an embodiment, the trenches 116a and 116b may have a substantially vertical sidewall, as shown in FIG. 2H and FIG. 3H. In another embodiment, the trenches 116a and 116b may have a slightly inclined sidewall (not shown). The trenches 116a and 116b expose the sidewalls of the dielectric layer 103, the middle layers 104, and the insulating layers 102, and expose the patterned conductive layer 94a. The trenches 116a divide the stack structure SK2 into a plurality of blocks B (as shown in FIG. 1B). The trenches 116b divide each block B into parts P1 and P2 (as shown in FIG. 1B). The selective source line cut slit 107 divides the parts P1 and P2 of each block B respectively into sub-blocks SB1 and SB2 (as shown in FIG. 1B and FIG. 2H).

Figure 2I:
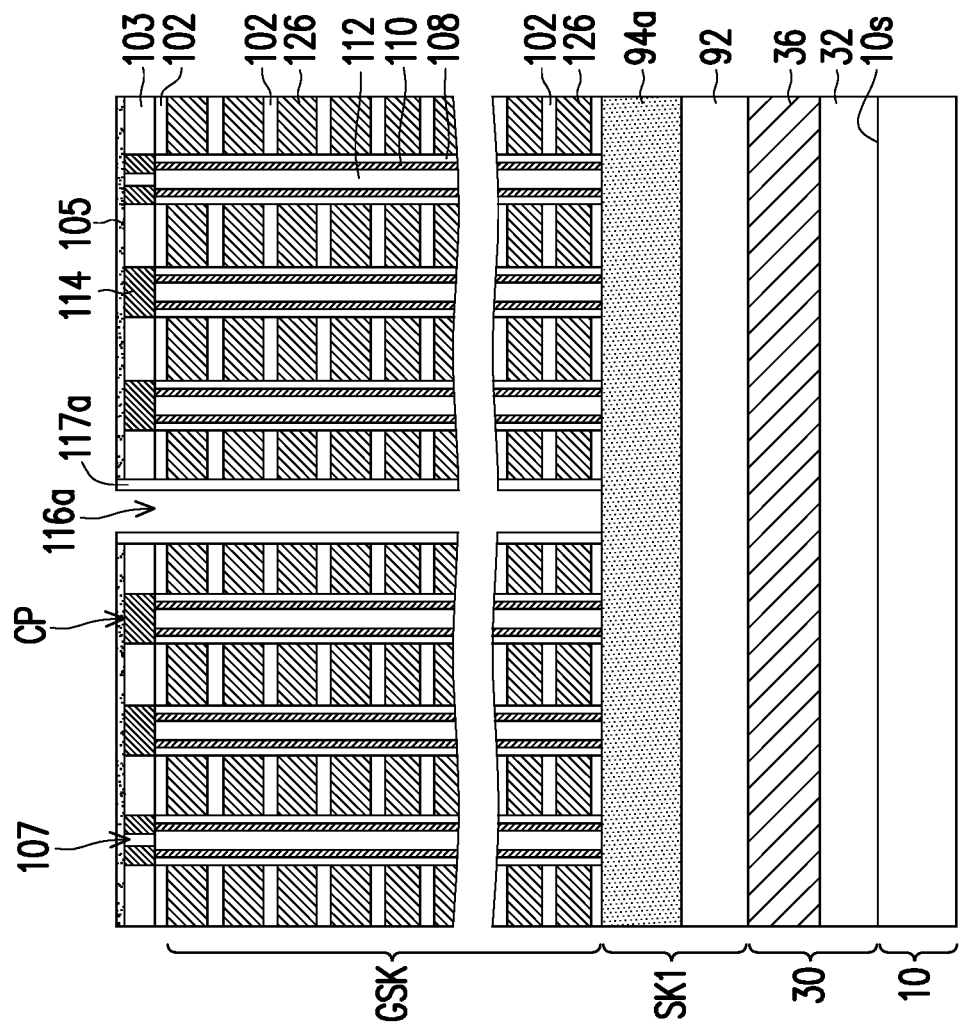

Referring to FIG. 2I and FIG. 3I, afterwards, a replacement process is performed to replace the middle layers 104 in the first region R1 and the second region R2 with conductive layers 126 and 126'. As illustrated in FIG. 2H and FIG. 3H, first, a selective etching process is performed, so that an etchant passes by the trenches 116a and 116b and the stack structure SK2 on their two sides. Accordingly, the middle layers 104 in the first region R1 and the second region R2 are removed to form a plurality of horizontal openings 121 and 121'. The horizontal opening 121 in the first region R1 exposes the sidewalls of part of the charge storage structure 108, the upper and lower surfaces of the insulating layer 102, and the sidewalls of the insulating pillars PIL2 (shown in FIG. 1B). The horizontal openings 121' in the second region R2 expose the upper and lower surfaces of the insulating layer 102, and the sidewalls of the insulating pillar PIL1. The selective etching process may be isotropic etching such as a wet etching process. The etchant used in the wet etching process is, for example, a hot phosphoric acid. In the etching process, the insulating slit PIL1 and the insulating pillars PIL2 (shown in FIG. 1B) may serve as a support wall and a support pillar.

Referring to FIG. 2I and FIG. 3I, then, a conductive material layer is formed in the trenches 116a and 116b and the horizontal openings 121 and 121'. Next, an etch-back process is performed to remove the conductive material layer in the trenches 116a and 116b and form conductive layers 126 and 126' respectively in the horizontal openings 121 and 121'. The conductive layers 126 may serve as a plurality of gate layers of the memory array. The conductive layers 126 and the insulating layers 102 are alternately stacked with each other to form a gate stack structure GSK. The conductive layers 126' may serve as a plurality of wraparound gate layers of the vertical transistors. The conductive layers 126' and the insulating layers 102 are alternately stacked with each other to form a gate stack structure GSK'. As shown in FIG. 3J, the conductive layers 126 and 126' include, for example, barrier layers 122 and 122' and metal layers 124 and 124'. In an embodiment, the material of the barrier layers 122 and 122' includes titanium (Ti), titanium nitride (TiN), tantalum (Ta), tantalum nitride (TaN), or a combination thereof, and the material of the metal layers 124 and 124' includes tungsten (W).

Referring to FIG. 2I and FIG. 3I again, next, spacers 117a and 117b are formed on the sidewalls of the trenches 116a and 116b respectively. The spacers 117a and 117b include a dielectric material different from the material of the insulating layer 102, and may be, for example, silicon nitride or a silicon oxide/silicon nitride/silicon oxide composite layer.

Figure 2J:
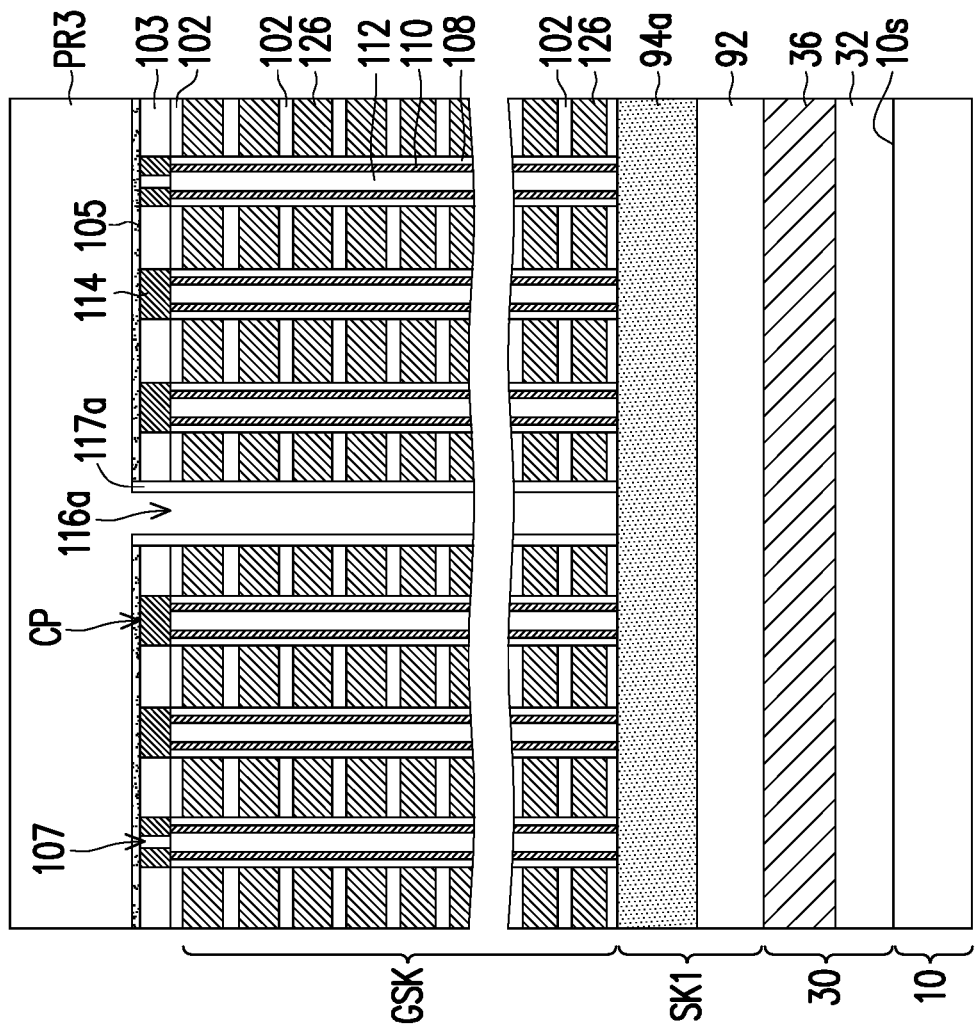

Referring to FIG. 2J and FIG. 3J, a mask layer PR3 is formed over the substrate 10. The mask layer PR3 has an opening OP5 exposing the trench 116b in the third region R3 and the spacer 117b on the sidewall thereof. Afterwards, an etching process is performed to remove the spacer 117b on the sidewall of the trench 116b, so that the etch stop layer 105, the dielectric layer 103 and the stack structure SK2 are exposed from the sidewall of the trench 116b, and the conductive layer 94a is exposed from the bottom of the trench 116b (as shown in FIG. 3J).

Figure 2K:
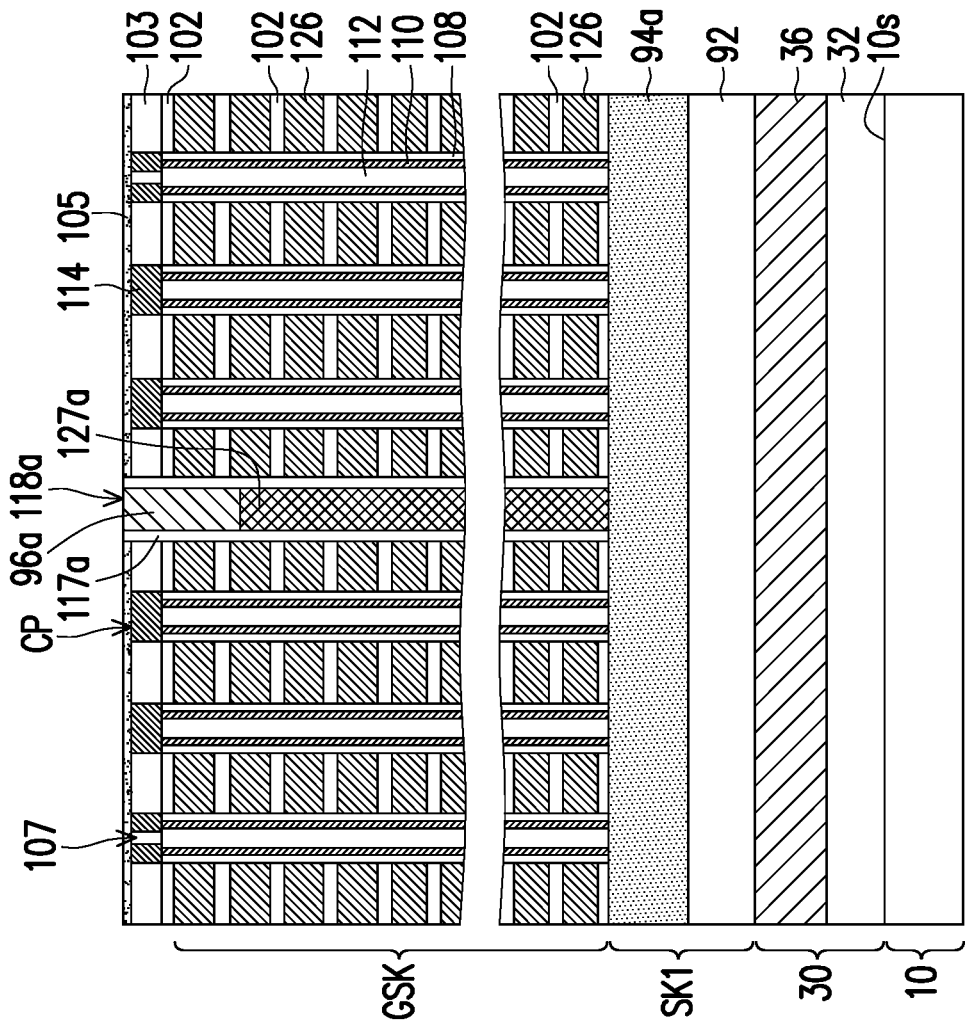

Referring to FIG. 2K and FIG. 3K, the mask layer PR3 is removed. Then, a conductive material layer is formed in the trenches 116a and 116b. Next, an etch-back process is performed to remove part of the conductive material layer in the trenches 116a and 116b and form conductive layers 127a and 127b respectively in the trenches 116a and 116b respectively. As illustrated in FIG. 3K, the conductive layer 127a and the gate stack structure GSK are separated by the spacer 117a. The conductive layer 127b is in contact with the gate stack structure GSK'. In some embodiments, the conductive layers 127a and 127b do not fully fill the trenches 116a and 116b, and grooves (not shown) are formed over the conductive layers 127a and 127b.

Next, referring to FIG. 2K and FIG. 3K, conductive pads 96a and 96b are formed in the grooves on the conductive layers 127a and 127b. The material of the conductive pads 96a and 96b includes, for example, tungsten. The conductive pad 96a and the conductive layer 127a together form a source line slit 118a for conducting a current from the patterned conductive layer (source line) 94a. As illustrated in FIG. 3K, the source line slit 118a is isolated by the spacer 117a to avoid contact with the conductive layer 126 of the memory array serving as a word line. The conductive pad 96b and the conductive layer 127b located in the second region R2 (and also in the third region R3) together form a common gate slit 118b. The common gate slit 118b may be referred to as a conductive slit 118b. As illustrated in FIG. 2K and FIG. 3K, the sidewall of the common gate slit 118b is in contact with and electrically connected to the conductive layer 126' of the pass transistors, and the bottom of the common gate slit 118b is in contact with and electrically connected to the patterned conductive layer 94. The common gate slit 118b may conduct a current from the patterned conductive layer (source line) 94a to the conductive layer 126' of each pass transistor.

Figure 2L:
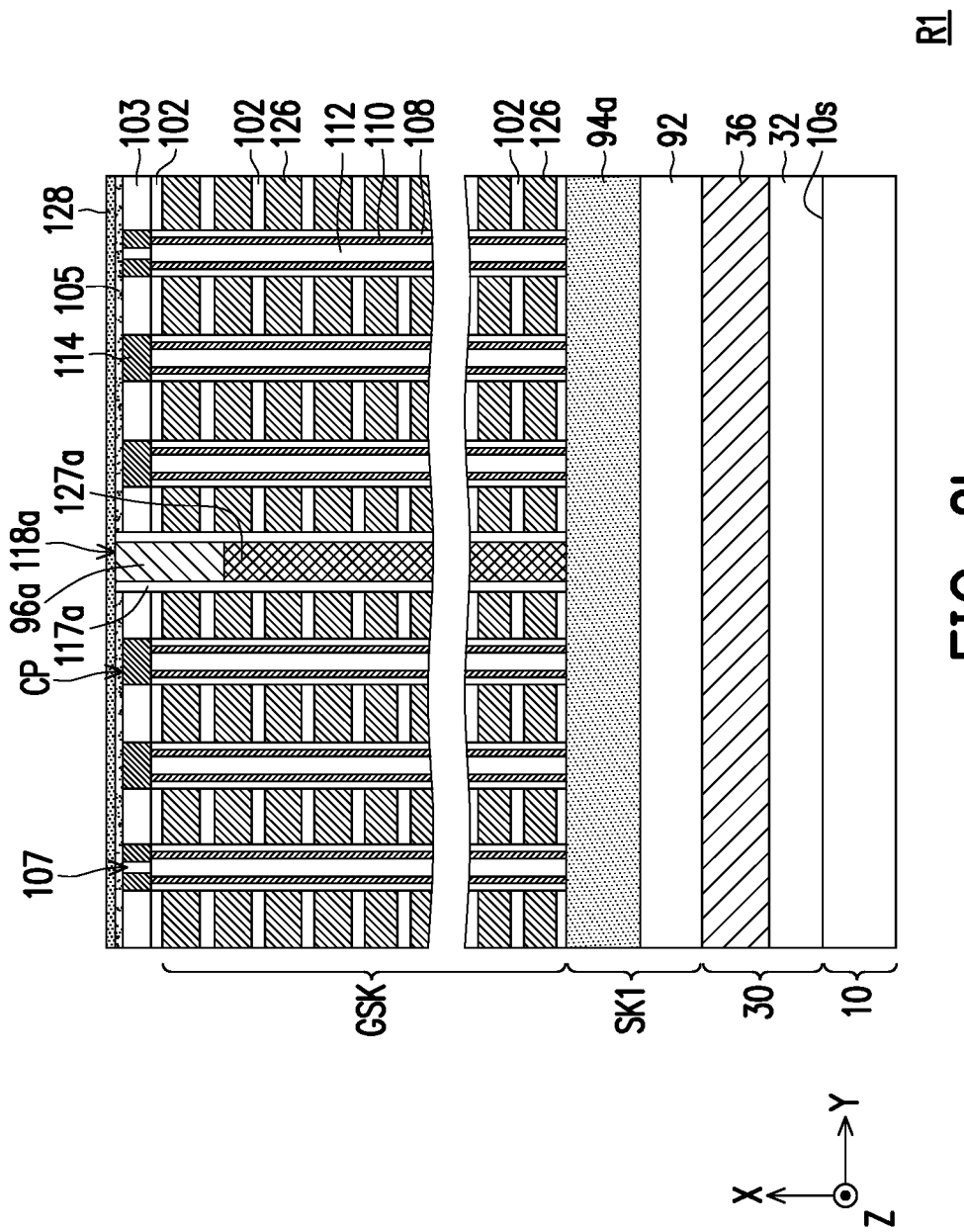

Referring to FIG. 2L and FIG. 3L, afterwards, a stop layer 128 is formed over the substrate 10. The material of the stop layer 128 includes, for example, silicon nitride. As illustrated in FIG. 3L, afterwards, lithography and etching processes and a deposition process are performed to form a plurality of contacts 129 passing through the stop layers 128 and 105 and the dielectric layer 103 in the second region R2, to respectively electrically connect the conductive layers (word lines) 126 in the second region (staircase region) R2 of the memory array.

Referring to FIG. 2L and FIG. 3L, a patterning process is performed to remove part of the stop layer 128, part of the dielectric layer 103, and part of the gate stack structures GSK' in the second region R2 to form an opening 206 exposing the conductive plug 97 at the bottom (as shown in FIG. 3L). In an embodiment, the opening 206 may have a substantially vertical sidewall, as shown in FIG. 3L. In another embodiment, the opening 206 may have a slightly inclined sidewall (not shown).

Figure 2M:
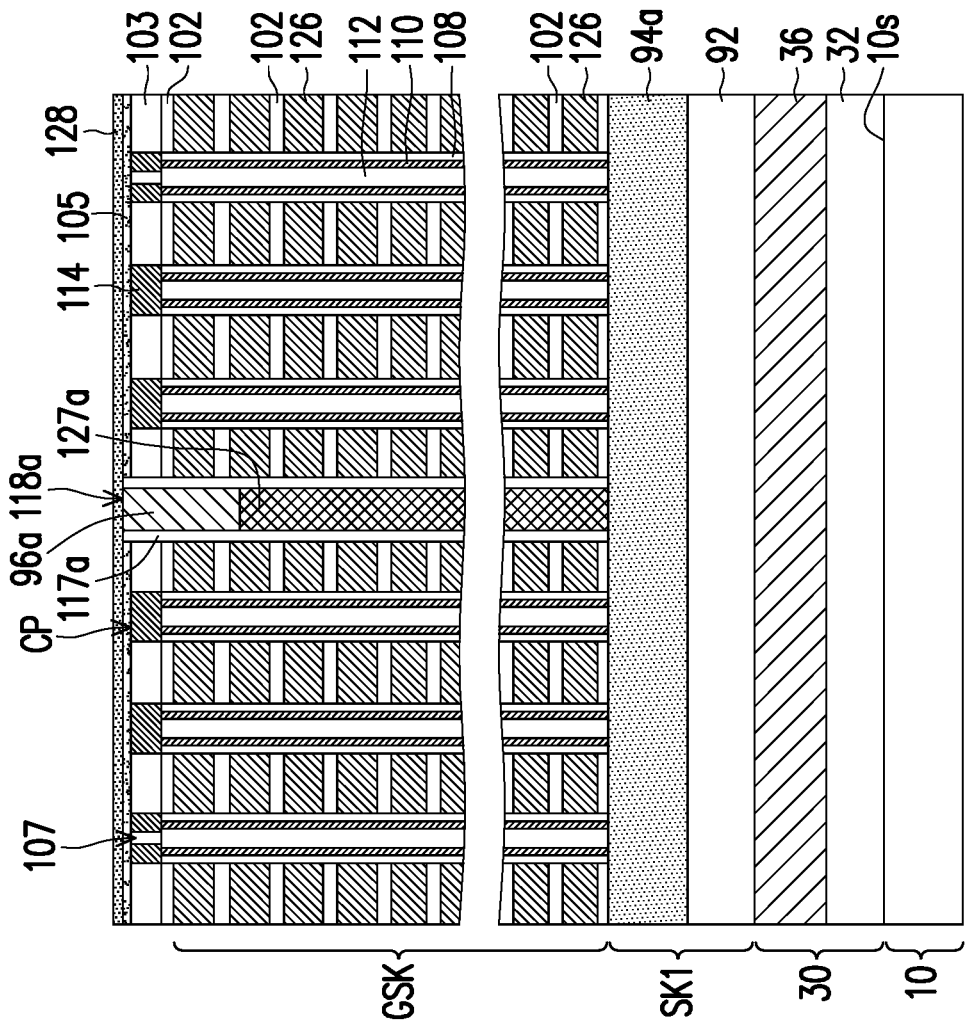

Next, referring to FIG. 2M and FIG. 3M, a gate dielectric layer 208 is formed on the sidewall of the opening 206 (as shown in FIG. 3M). The gate dielectric layer 208 is formed on the sidewall of the opening 206 in the form of a spacer and exposes the bottom surface of the opening 206. The material of the gate dielectric layer 208 includes, for example, silicon oxide, silicon nitride, or a dielectric material layer having a high dielectric constant. The method of forming the gate dielectric layer 208 includes, for example, first depositing a gate dielectric material layer, and then performing an anisotropic etching process on the gate dielectric layer 208 to expose the conductive plug 97.

Next, referring to FIG. 2M and FIG. 3M, a channel pillar 210, a sacrificial layer 211, and an insulating pillar 212 are formed on the gate dielectric layer 208 (as shown in FIG. 3M). The material of the channel pillar 210 includes, for example, polysilicon. In an embodiment, the channel pillar 210 covers at least an internal surface of the gate dielectric layer 208 on the sidewall of the opening 206, and the channel pillar 210 also covers the bottom surface of the opening 206 to be electrically connected to the conductive plug 97 below. The sacrificial layer 211 is covered on the channel pillar 210. The sacrificial layer 211 is, for example, a silicon nitride layer. The insulating pillar 212 is filled in a remaining space of the opening 206 and is surrounded by the channel pillar 210. Since the channel pillar 210 surrounds the insulating pillar 212, the channel pillar 210 may also be referred to as a channel tube. In some embodiments, the insulating pillar 212 includes a silicon oxide layer. The method of forming the channel pillar 210, the sacrificial layer 211, and the insulating pillar 212 includes, for example, forming a channel material layer, a sacrificial material layer, and an insulating material layer over the substrate 10 and in the opening 206. Then, with the stop layer 128 serving as a polishing stop layer, a planarization process, such as a chemical-mechanical polishing process, is performed to remove the excessive channel material layer, sacrificial material layer, and insulating material layer.

Figure 2N:
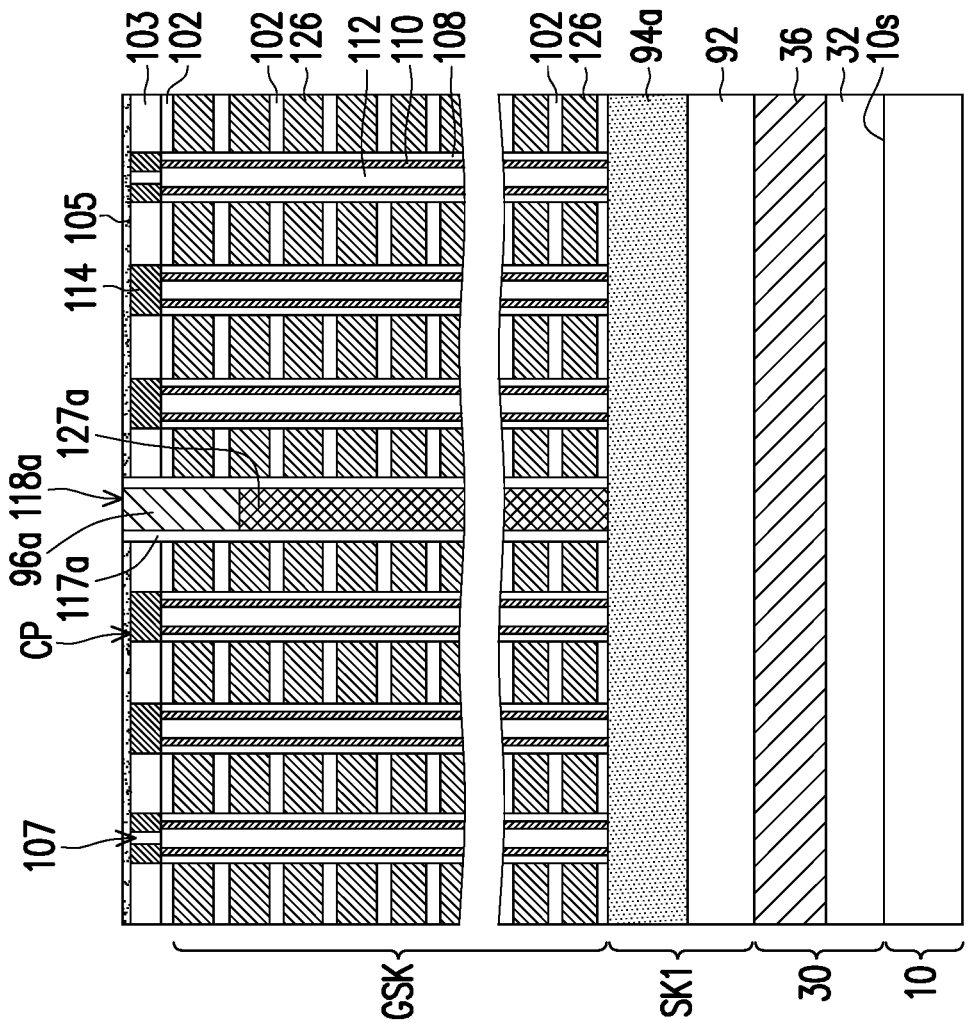
Figure 20:
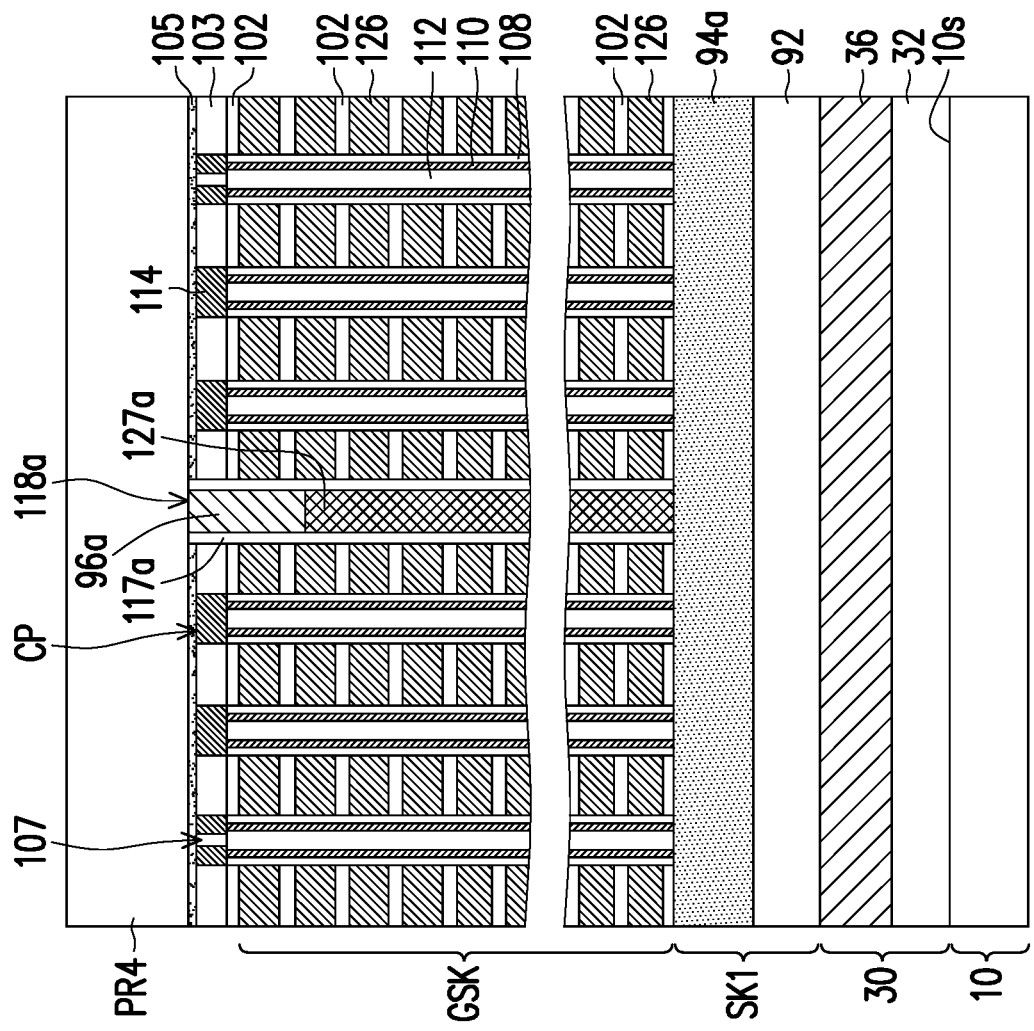

Next, referring to FIG. 2N and FIG. 3N, an etching process, such as a wet etching process, is performed to remove part of the sacrificial layer 211 in the second region R2 to form a groove 213 (as shown in FIG. 3N). As illustrated in FIG. 3N, the sidewall of the groove 213 exposes the channel pillar 210 and the insulating pillar 212. The height of the bottom surface of the groove 213 is lower than the bottom surface of the uppermost one or more (e.g., three) layers of the conductive layers 126'. In some embodiments, in the etching process, the stop layer 128, part of the gate dielectric layer 208, and part of the insulating pillar 212 are also etched, so that the top surfaces of the remaining gate dielectric layer 208 and insulating pillar 212 are lower than the top surface of the dielectric layer 103.

Referring to FIG. 2O and FIG. 3O, a mask layer PR4 is formed over the substrate 10 (as shown in FIG. 2O). The mask layer PR4 has an opening OP6 exposing the second region R2 (as shown in FIG. 3O). Afterwards, an etching process is performed to remove part of the channel pillar 210 to increase the width of the groove 213 to form a groove 213'.

Figure 2P:
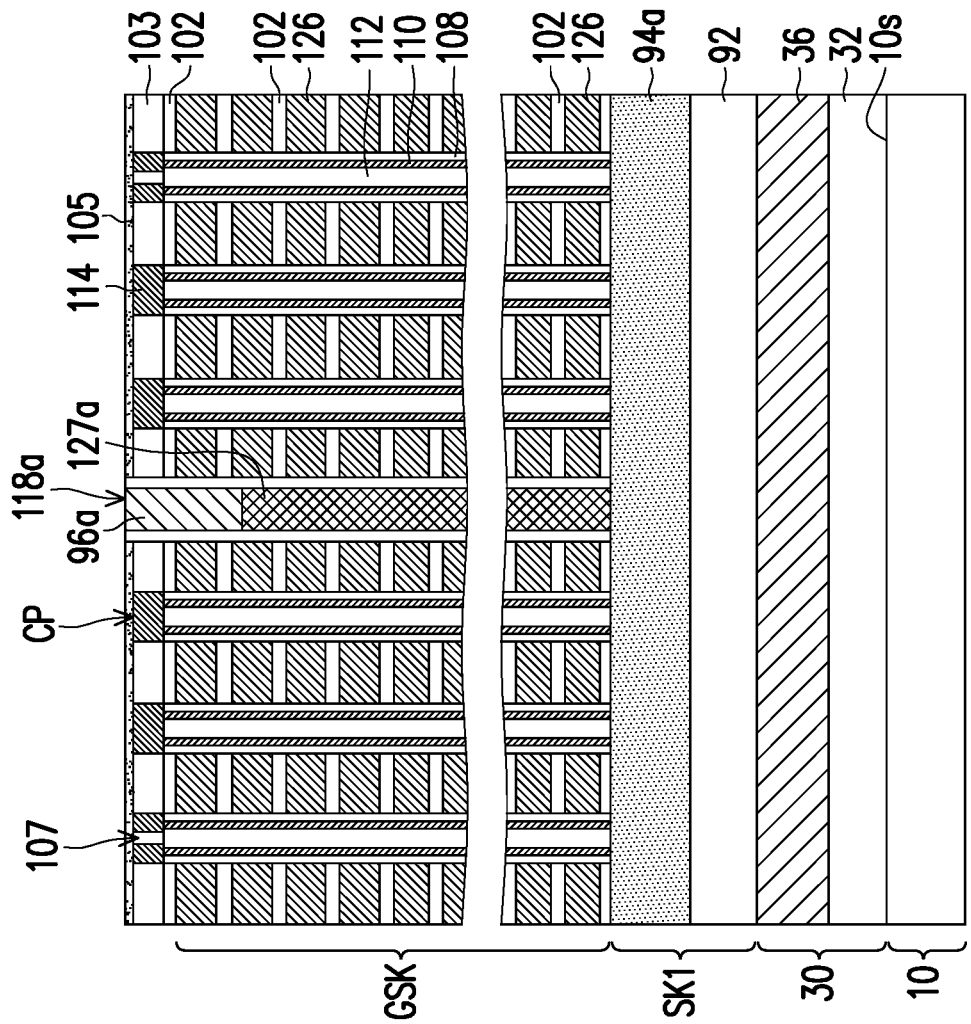
Figure 2Q:
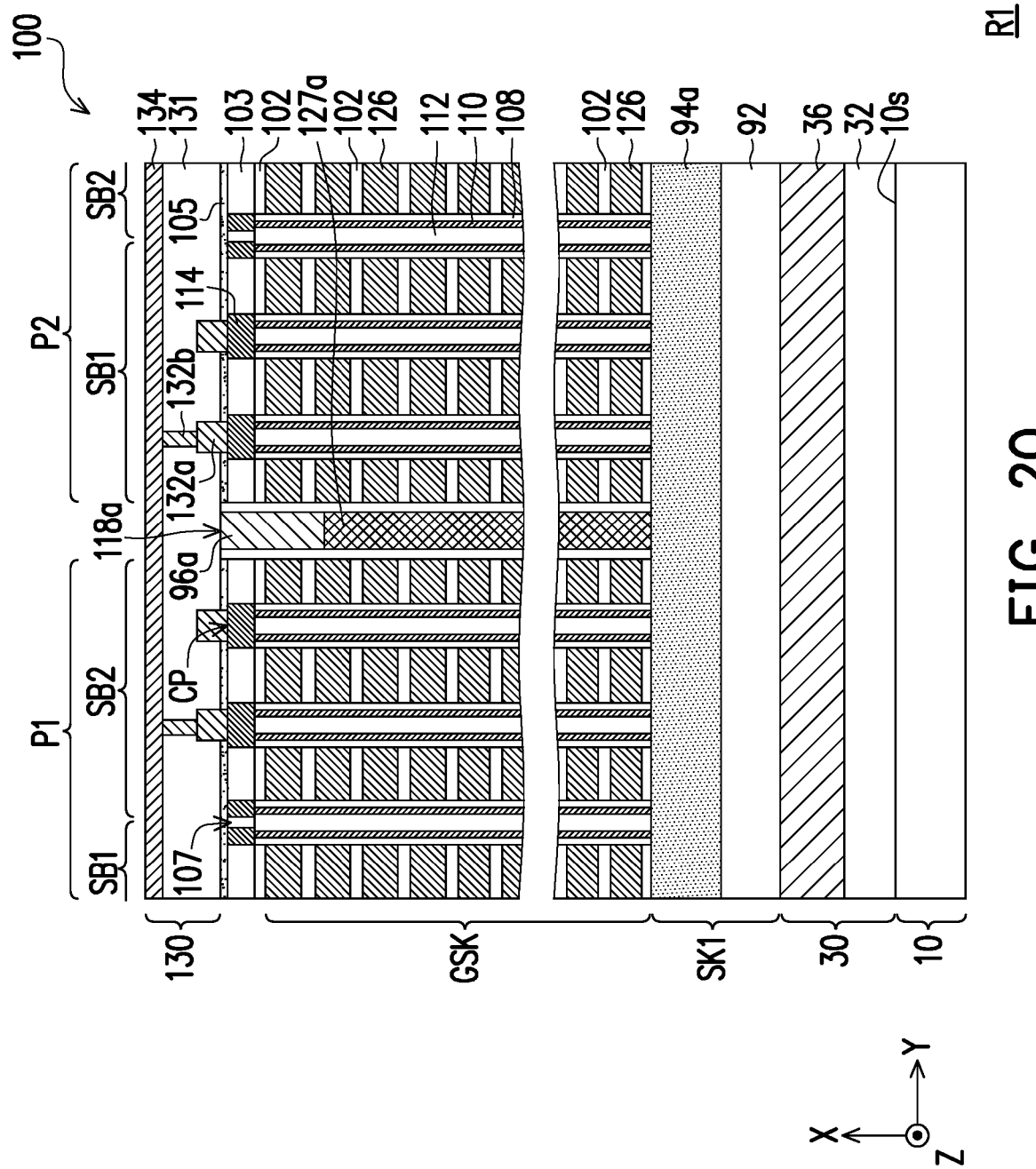

Referring to FIG. 2P and FIG. 3P, the mask layer PR4 is removed. Afterwards, referring to FIG. 3P, a conductive material layer (not shown) is formed over the substrate 10 and fill in the groove 213'. The material of the conductive material layer includes, for example, tungsten. Then, with the stop layer 105 serving as a polishing stop layer, a planarization process, such as a chemical-mechanical polishing process, is performed to remove the excessive conductive material layer to form a conductive plug 214 in the groove 213' (shown in FIG. 3O) and on the insulating pillar 212. The conductive plug 214 may include a conductive pillar 214a and a conductive cap 214b. The conductive pillar 214a is formed in the groove 213' (shown in FIG. 3O) and surrounds the sidewall and the top surface of the insulating pillar 212, and the bottom of the conductive pillar 214a is electrically connected to the channel pillar 210. The conductive cap 214b is located on the conductive pillar 214a and extends laterally to cover the top surfaces of the gate dielectric layer 208 and the insulating pillar 212.

Referring to FIG. 2Q and FIG. 3Q, an interconnect structure 130 is formed over the substrate 10. The interconnect structure 130 is located above the gate stack structures GSK and GSK', so the interconnect structure 130 may also be referred to as an upper interconnect structure 130 or second interconnect structure 130. The interconnect structure 130 includes a dielectric layer 131 and an interconnect 133 in the dielectric layer 131. The interconnect 133 may be referred to as a second interconnect. The interconnect 133 includes a plurality of vias 132a and 132b and a conductive line 134. The interconnect 133 may be referred to as a second interconnect 133. The method of forming the upper interconnect structure 130 includes the following. The dielectric layer 131 is formed on the substrate 10, and the plurality of vias 132a and 132b are formed in the dielectric layer 131. The via 132b is located on the via 132a. The vias 132a are electrically connected to the conductive plug 114 (in the first region R1), the conductive plug 214 (in the second region R2), and the contact 129 (in the second region R2), respectively. Afterwards, a conductive material layer is formed over the substrate 10, and the conductive material layer is patterned to form the conductive line 134. The conductive plugs 214 at two sides of the common gate slit 118b may be electrically connected to each other through the vias 132a and 132b and the conductive line 134, and may be electrically connected to the conductive layer (word line) 126 of the memory array through the conductive line 134 and the contact 129. The common gate slit 118b may be connected to a pass gate control terminal (local select line) through the interconnect structure 130.

Referring to FIG. 3Q, in this embodiment, vertical transistors T are disposed above the substrate 10 in the second region (staircase region) R2. The vertical transistors T may serve as pass transistors. The vertical transistor T is a vertical gate all around transistor, and includes a conductive layer (also referred to as a wraparound gate layer) 126', a channel pillar 210, a first conductive plug 97, a second conductive plug 214, and a gate dielectric layer 208. The vertical transistors T may include a vertical transistor T1 and a vertical transistor T2. In some embodiments, the vertical transistor T1 may be referred to as a first vertical transistor T1 and a vertical transistor T2 may be referred to as a second vertical transistor T2.

Referring to FIG. 3Q, the wraparound gate layer 126' of the vertical transistor T is laterally adjacent to the gate stack structure GSK. In this embodiment, each vertical transistor T includes a plurality of wraparound gate layers 126'. The wraparound gate layers 126' are stacked above the substrate 10 and are parallel to the surface 10s of the substrate 10. The wraparound gate layers 126' are electrically isolated from each other by the insulating layer 102. The wraparound gate layers 126' and the insulating layers 102 form a gate stack structure GSK'. The wraparound gate layers 126' of the gate stack structure GSK' are coplanar with part of the gate layers 126 of the gate stack structure GSK. The gate stack structure GSK' and the gate stack structure GSK are electrically isolated from each other by the insulating slit PIL1. The number of layers of the wraparound gate layers 126' of the gate stack structure GSK' is less than the number of layers of the gate layers 126 of the gate stack structure GSK. In some embodiments, the number of layers of the wraparound gate layers 126' of the gate stack structure GSK' is, for example, less than 30; the number of layers of the gate layers 126 of the gate stack structure GSK is, for example, 200, but the disclosure is not limited thereof. Therefore, the level of the wraparound gate layers 126' of the gate stack structure GSK' is equal to or higher than the level of the bottommost gate layer 126 of the gate stack structure GSK and is lower than the level of the topmost gate layer 126 of the gate stack structure GSK.

Referring to FIG. 3Q, the channel pillar 210 of each vertical transistor T continuously extends through the gate layer 126' of the gate stack structure GSK'. In some embodiments, the channel pillar 210 may have a ring shape in a top view. The material of the channel pillar 210 may be a semiconductor, such as undoped polysilicon. The first conductive plug 97 of each vertical transistor T is located at the bottom of the channel pillar 210. The first conductive plug 97 of each vertical transistor T may be serves as a first source and drain, e.g., a source and may be electrically connected to the bottom of the channel pillar 210. The second conductive plug 214 of each vertical transistor T is located at the top surface of the channel pillar 210. The second conductive plug 214 of each vertical transistor T may be serves as a second source and drain, e.g., a drain, and electrically connected to the top surface of the channel pillar 210.

Referring to FIG. 3Q, the gate dielectric layer 208 of each vertical transistor T continuously extends through the gate stack structure GSK' and is horizontally located between the wraparound gate layers 126' and the channel pillar 210, and longitudinally located between the first conductive plug 97 and the second conductive plug 214. The gate dielectric layer 208, the channel pillar 210, and the second conductive plug 214 are surrounded by the wraparound gate layers 126'. The vertical transistor T may further include an insulating pillar 212 disposed in a space among sacrificial layer 211, the channel pillar 210 and the second conductive plug 214.

Referring to FIG. 1B and FIG. 3Q, in this embodiment, each stair of the staircase structure SC in the second region (staircase region) R2 of each block B includes vertical transistors T1 and T2 which are adjacent to each other and arranged along the direction Y. In FIG. 1B, three stairs SC1, SC2, and SC3 are shown. The vertical transistors T1 of the three stairs SC1, SC2, and SC3 are arranged in a row along the direction X; the vertical transistor T2 of the three stairs SC1, SC2, and SC3 are arranged in a row along the direction X. The vertical transistors T1 and T2 of the three stairs SC1, SC2, and SC3 may be arranged in two rows along the direction X.

Referring to FIG. 1B and FIG. 3Q, a common gate slit 118b is further included between the vertical transistors T1 and the vertical transistors T2. The common gate slit 118b may be referred to as a conductive slit 118b. The common gate slit 118b passes through wraparound gate layers 126' of the vertical transistor T1 and wraparound gate layers 126' of the vertical transistor T2, and is electrically connected to the patterned conductive layer 94a which serves as the common source plate.

Referring to FIG. 1B and FIG. 3Q, the wraparound gate layers 126' of the vertical transistor T1 and the wraparound gate layers 126' of the vertical transistor T2 are electrically connected to the common gate slit 118b and are electrically connected through the common gate slit 118b to the patterned conductive layer 94a which serves as the common source plate. The first conductive plug (source) 97 of the vertical transistor T1 and the first conductive plug (source) 97 of the vertical transistor T2 are electrically connected to each other respectively through the conductive lines 36 of the lower interconnect structure 30. The second conductive plug (drain) 214 of the vertical transistor T1 and the second conductive plug (drain) 214 of the vertical transistor T2 are electrically connected to each other respectively through the vias 132a and 132b and the conductive line 134 of the upper interconnect structure 130.

Figure 4:
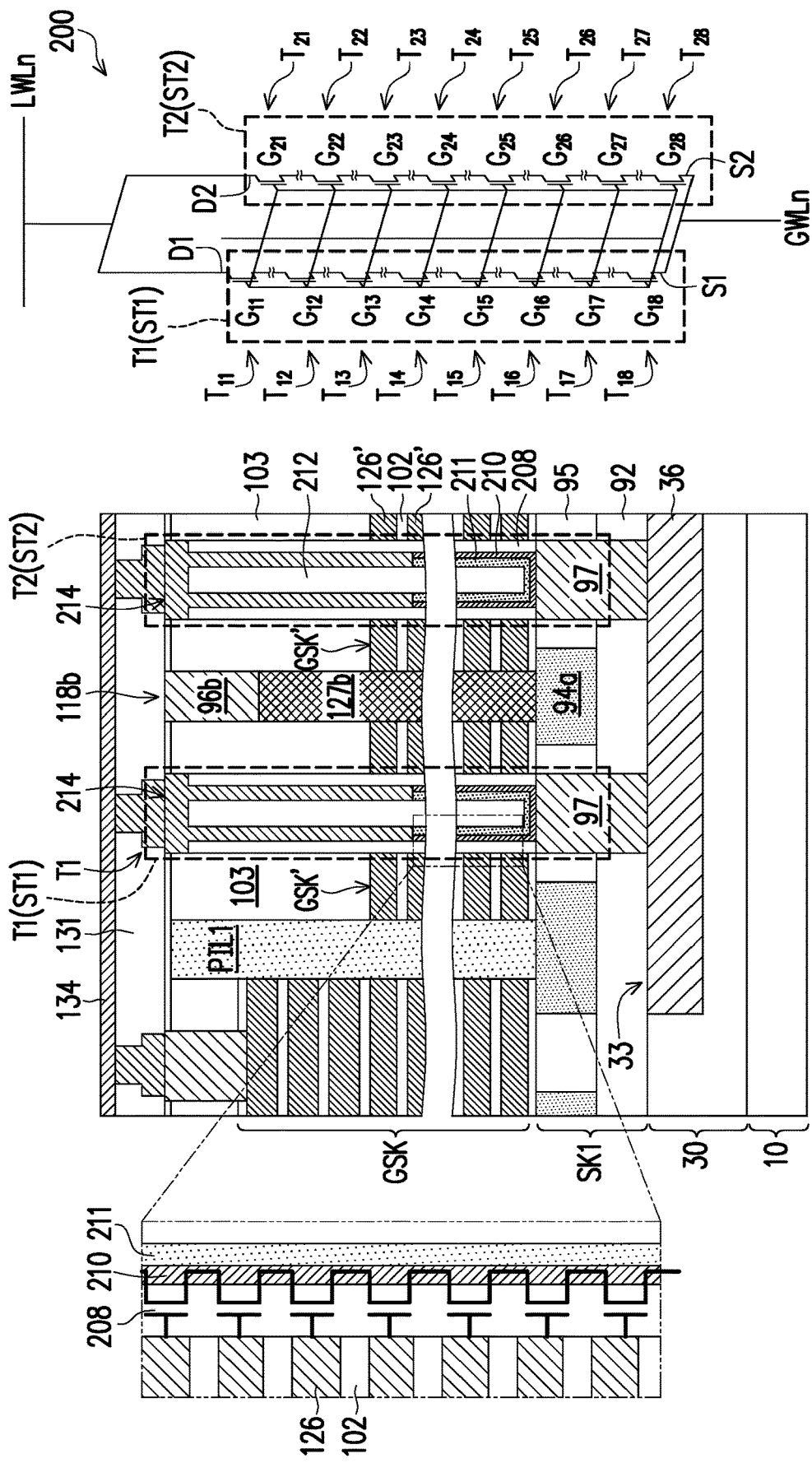
FIG. 4 shows a schematic diagram of a partial region of FIG. 3Q and a corresponding circuit.

FIG. 4 shows a schematic view of a partial region and a circuit corresponding to FIG. 3Q.

Referring to FIG. 4, in some embodiments, the vertical transistor T1 is replaced by a transistor string ST1. The transistor string ST1 includes a plurality of vertical transistors $T_{11}, T_{12}, \ldots, T_{18}$ connected in series. The vertical transistor T2 is replaced by a transistor string ST2. The transistor string ST2 includes a plurality of vertical transistors $T_{21}, T_{22}, \ldots, T_{28}$ connected in series. Gates $G_{11}, G_{12}, \ldots, G_{18}$ of the vertical transistors $T_{11}, T_{12}, T_{18}$ and gates $G_{21}, G_{22}, \ldots, G_{28}$ of the vertical transistors $T_{21}, T_{22}, \ldots, T_{28}$ are all electrically connected to the common gate slit 118b. The common gate slit 118b is then connected to the pass gate control terminal (local select line).

Referring to FIG. 4, in some embodiments, the first conductive plug 97 of the vertical transistor T1 serves as a first source and drain, e.g., a first source S1; the second conductive plug 214 of the vertical transistor T1 serves as a second source and drain, e.g., a first drain D1. The first conductive plug 97 of the vertical transistor T12 serves as a third source and drain, e.g., a second source S2; the second conductive plug 214 of the vertical transistor T2 serves as a fourth source and drain, e.g., a second drain D2.

The first source S1 of the vertical transistor T1 and the second source S2 of the vertical transistor T2 are electrically connected to each other and are connected to a global word line $GWL_n$. The first drain D1 of the vertical transistor T1 and the second drain D2 of the vertical transistor T2 are electrically connected to each other and are connected to a local word line $LWL_n$.

In the embodiments of the disclosure, the vertical transistors serving as the pass transistors are disposed to be laterally adjacent to the memory array. The distance between the gates of the pass transistors may be reduced, and therefore, the required chip area may be reduced.

What is claimed is:

1. A memory device comprising:
   a dielectric substrate comprising an array region and a staircase region;
   a memory array comprising:
   a gate stack structure comprising a plurality of gate layers and a plurality of insulating layers alternately disposed above the dielectric substrate in the array region and the staircase region;
   a plurality of first vertical transistors, stacked on each other and disposed above the dielectric substrate in the staircase region, comprising:
   a plurality of first wraparound gate layers separated from each other and laterally adjacent to the gate stack structure;
   a channel pillar extending through the first wraparound gate layers;
   a gate dielectric layer disposed between the channel pillar and the first wraparound gate layers;
   a first source/drain region located below a bottom of the channel pillar and electrically connected to the bottom of the channel pillar; and
   a second source/drain region located above a top of the channel pillar and electrically connected to the top of the channel pillar,
   wherein the memory device further comprises:
   a first interconnect located below the first source/drain region and electrically connected to the first source/drain region;
   a second interconnect located above the second source/drain region and electrically connected to the second source/drain region and one of the plurality of gate layers of the gate stack structure;
   at least one second vertical transistor disposed in the staircase region and adjacent to the first vertical transistors; and
   a common gate slit located between the first vertical transistors and the at least one second vertical transistor, and electrically connecting the first wraparound gate layers of the first vertical transistors and a second wraparound gate layer of the at least one second vertical transistor,
   wherein the first interconnect is further connected to a third source/drain region of the second vertical transistor, and the second interconnect is further connected to a fourth source/drain region of the second vertical transistor.

2. The memory device according to claim 1, wherein a level of a topmost first wraparound gate layer is lower than a level of a topmost gate layer of the gate stack structure.

3. The memory device according to claim 1, wherein a number of layers of the plurality of first wraparound gate layers is less than a number of layers of a plurality of gate layers of a gate stack structure of the memory array.

4. The memory device according to claim 1, wherein the plurality of first wraparound gate layers of the plurality of first vertical transistors are coplanar with part of the plurality of gate layers of the gate stack structure.

5. The memory device according to claim 1, wherein the at least one second vertical transistor comprises a plurality of second vertical transistors stacked on each other, and the common gate slit passes through and is electrically connected to a plurality of second wraparound gate layers of the plurality of second vertical transistors.

6. The memory device according to claim 5, wherein the plurality of second wraparound gate layers and the gate stack structure are separated from each other by an insulating slit.

7. A memory device comprising:
a substrate;
a first interconnect structure located on the substrate;
a memory array located on the first interconnect structure;
a plurality of vertical transistors located on the first interconnect structure; and
a second interconnect structure located on the memory array and electrically connected to the plurality of vertical transistors,
wherein the plurality of vertical transistors comprise a first vertical transistor and a second vertical transistor adjacent to each other, and
wherein the memory device further comprises:
a common gate slit located between the first vertical transistor and the second vertical transistor, and electrically connecting first wraparound gate layers of the first vertical transistor and second wraparound gate layers of the second vertical transistor,
the first interconnect located below a first source/drain region of the first vertical transistor and electrically connected to the first source/drain region,
the second interconnect located below a second source/drain region of the first vertical transistor and electrically connected to the second source/drain region,
the first interconnect electrically connected to a third source/drain region of the second vertical transistor, and
the second interconnect electrically connected to a fourth source/drain region of the second vertical transistor.

8. The memory device according to claim 7, wherein a number of layers of the plurality of first wraparound gate layers is less than a number of layers of a plurality of gate layers of a gate stack structure of the memory array.

* * * * *